(12) United States Patent
Nishiwaki et al.

(10) Patent No.: US 11,112,552 B2
(45) Date of Patent: Sep. 7, 2021

(54) LIGHT-GUIDE SHEET AND PHOTOELECTRIC CONVERSION DEVICE

(71) Applicant: Panasonic Intellectual Property Management Co., Ltd., Osaka (JP)

(72) Inventors: Seiji Nishiwaki, Hyogo (JP); Bunzi Mizuno, Nara (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 16/840,932

(22) Filed: Apr. 6, 2020

(65) Prior Publication Data

US 2020/0233139 A1     Jul. 23, 2020

Related U.S. Application Data

(63) Continuation of application No. PCT/JP2018/037886, filed on Oct. 11, 2018.

(30) Foreign Application Priority Data

Oct. 20, 2017    (JP) .............................. JP2017-203075

(51) Int. Cl.
    *G02B 1/14*        (2015.01)
    *F21V 8/00*        (2006.01)
                 (Continued)

(52) U.S. Cl.
    CPC .......... *G02B 6/0025* (2013.01); *G02B 5/0252* (2013.01); *G02B 6/0016* (2013.01);
                 (Continued)

(58) Field of Classification Search
    CPC .. G02B 6/0025; G02B 5/0252; G02B 6/0051; G02B 6/0053; G02B 6/0055
    See application file for complete search history.

(56) References Cited

U.S. PATENT DOCUMENTS

2007/0086191 A1*   4/2007   Choi ..................... G02B 6/005
                                              362/268
2009/0199893 A1    8/2009   Bita et al.
                 (Continued)

FOREIGN PATENT DOCUMENTS

JP        2014-3309      1/2014
WO     2012/046414    4/2012
              (Continued)

OTHER PUBLICATIONS

International Search Report dated Jan. 8, 2019 in corresponding International Application No. PCT/JP2018/037886.

*Primary Examiner* — Eric Wong
(74) *Attorney, Agent, or Firm* — Wenderoth, Lind & Ponack, L.L.P.

(57) ABSTRACT

A light-guide sheet according to the present disclosure is a light-guide sheet that takes in incident light and waveguides light in a direction intersecting with an incident direction of the incident light inside the light-guide sheet. The light-guide sheet includes: a lower refractive index layer; a light-transmissive layer that is continuously stacked with the lower refractive index layer and has a refractive index that is higher than a refractive index of the lower refractive index layer; and a diffraction grating that is disposed on the light-transmissive layer and changes a travelling direction of the incident light. A pattern of the diffraction grating is divided into a plurality of partial patterns on the light-transmissive layer, and each of the plurality of partial patterns has a concentric circular shape or a concentric polygonal shape.

16 Claims, 30 Drawing Sheets

(51) Int. Cl.
*H01L 31/054* (2014.01)
*G02B 6/42* (2006.01)
*G02F 1/00* (2006.01)
*G02B 5/02* (2006.01)

(52) U.S. Cl.
CPC ............ *G02B 6/0028* (2013.01); *G02B 6/42* (2013.01); *G02F 1/00* (2013.01); *H01L 31/0547* (2014.12)

(56) References Cited

U.S. PATENT DOCUMENTS

| 2009/0199900 | A1  | 8/2009  | Bita et al. |
| 2011/0080739 | A1* | 4/2011  | Shantha ............... H01J 61/327 362/294 |
| 2011/0090697 | A1* | 4/2011  | Matsuzaki ........... G02B 5/0252 362/293 |
| 2011/0220195 | A1* | 9/2011  | Moronaga ........... H01L 31/0547 136/256 |
| 2013/0235287 | A1* | 9/2013  | Im ......................... G02B 30/27 349/15 |
| 2013/0264470 | A1  | 10/2013 | Nishiwaki |
| 2014/0050441 | A1  | 2/2014  | Wakabayashi et al. |
| 2014/0166078 | A1* | 6/2014  | Yamamoto ............ H01L 31/043 136/246 |
| 2015/0168651 | A1  | 6/2015  | Nishiwaki |
| 2018/0095217 | A1* | 4/2018  | Min ......................... G02B 1/14 |

FOREIGN PATENT DOCUMENTS

| WO | 2013/080522 | 6/2013 |
| WO | 2014/199572 | 12/2014 |

\* cited by examiner

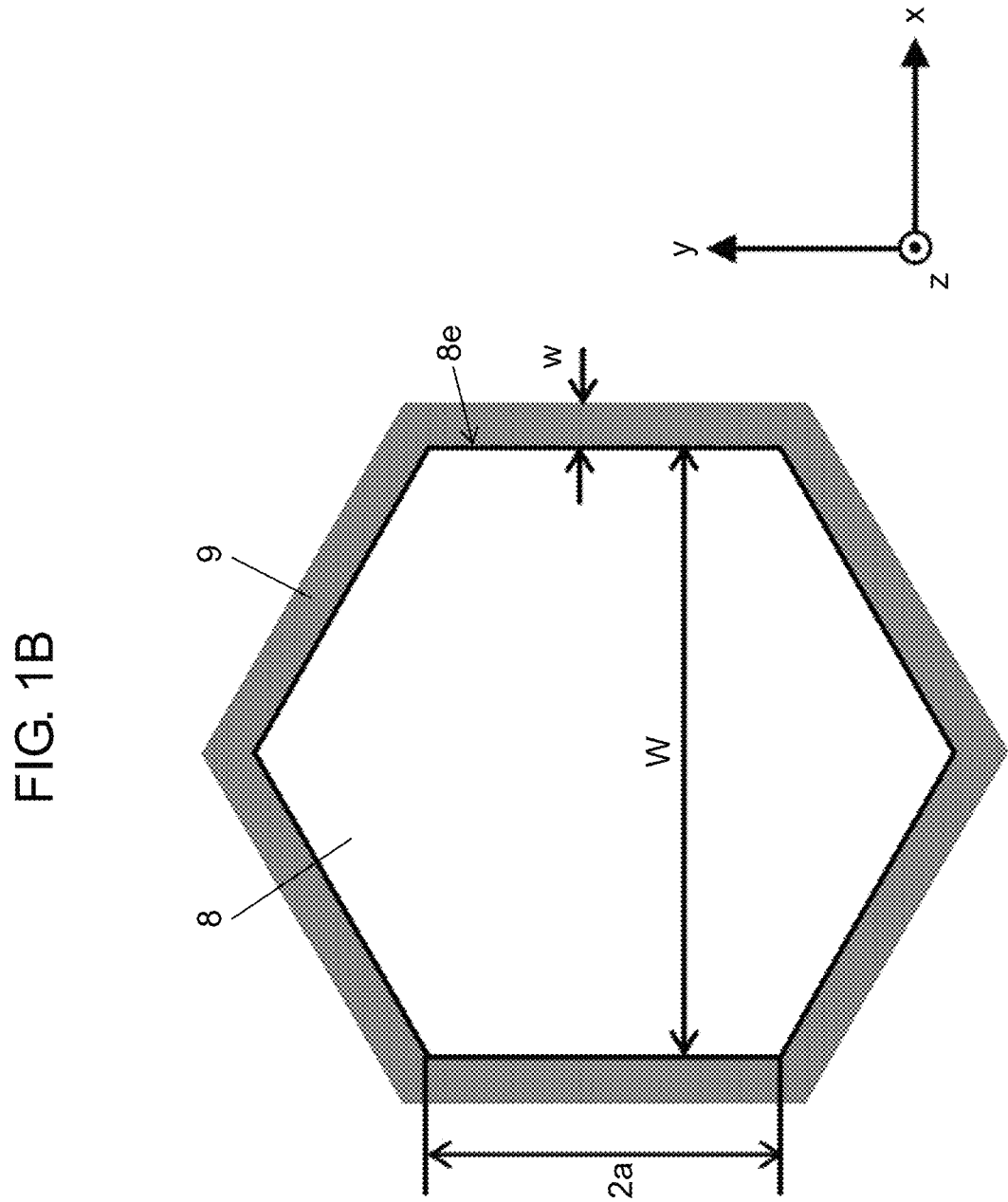

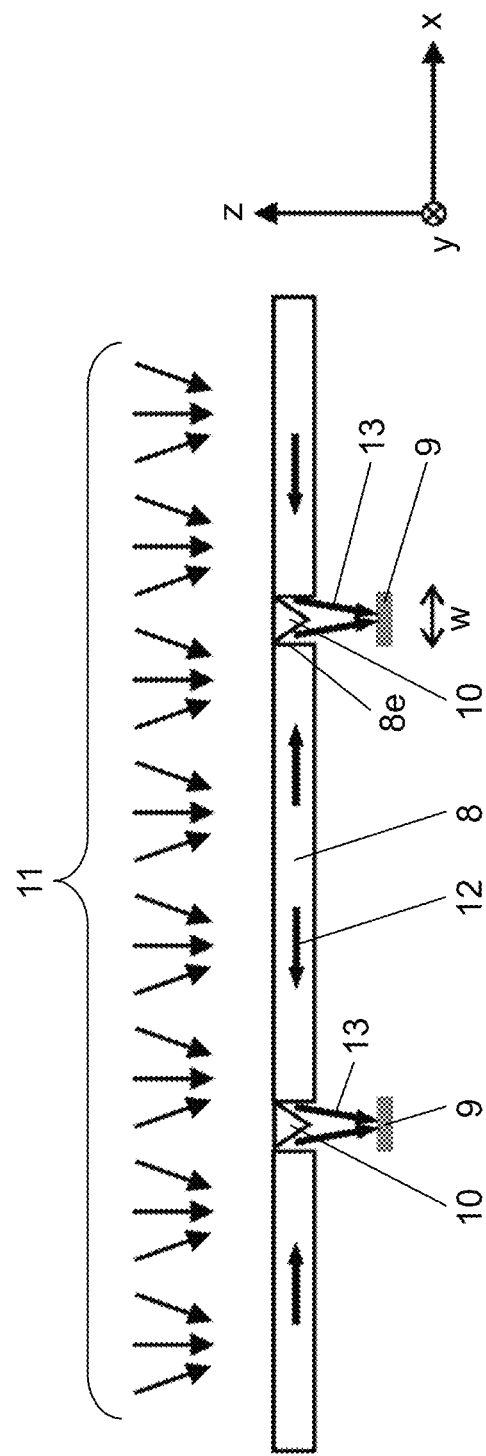

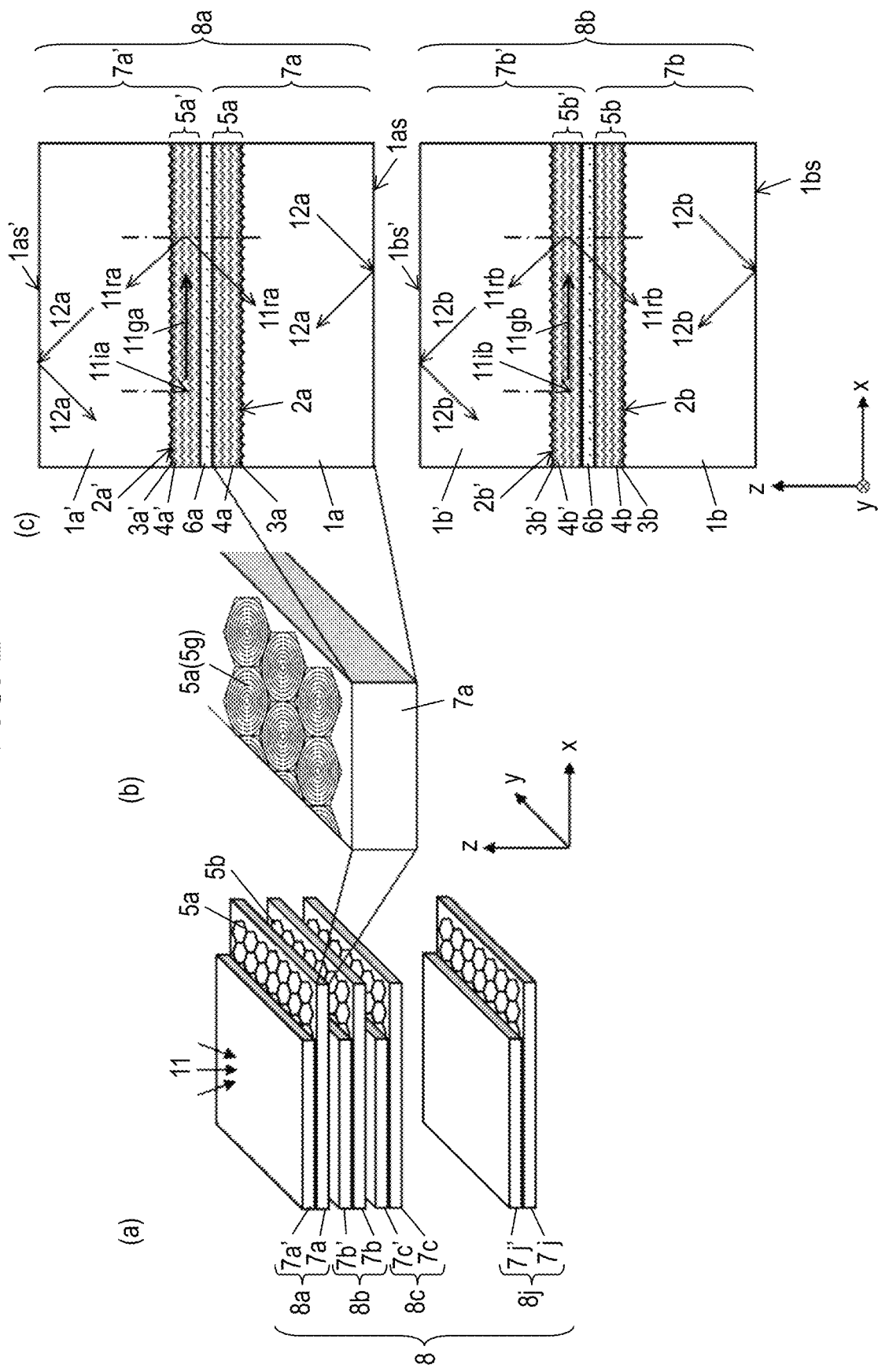

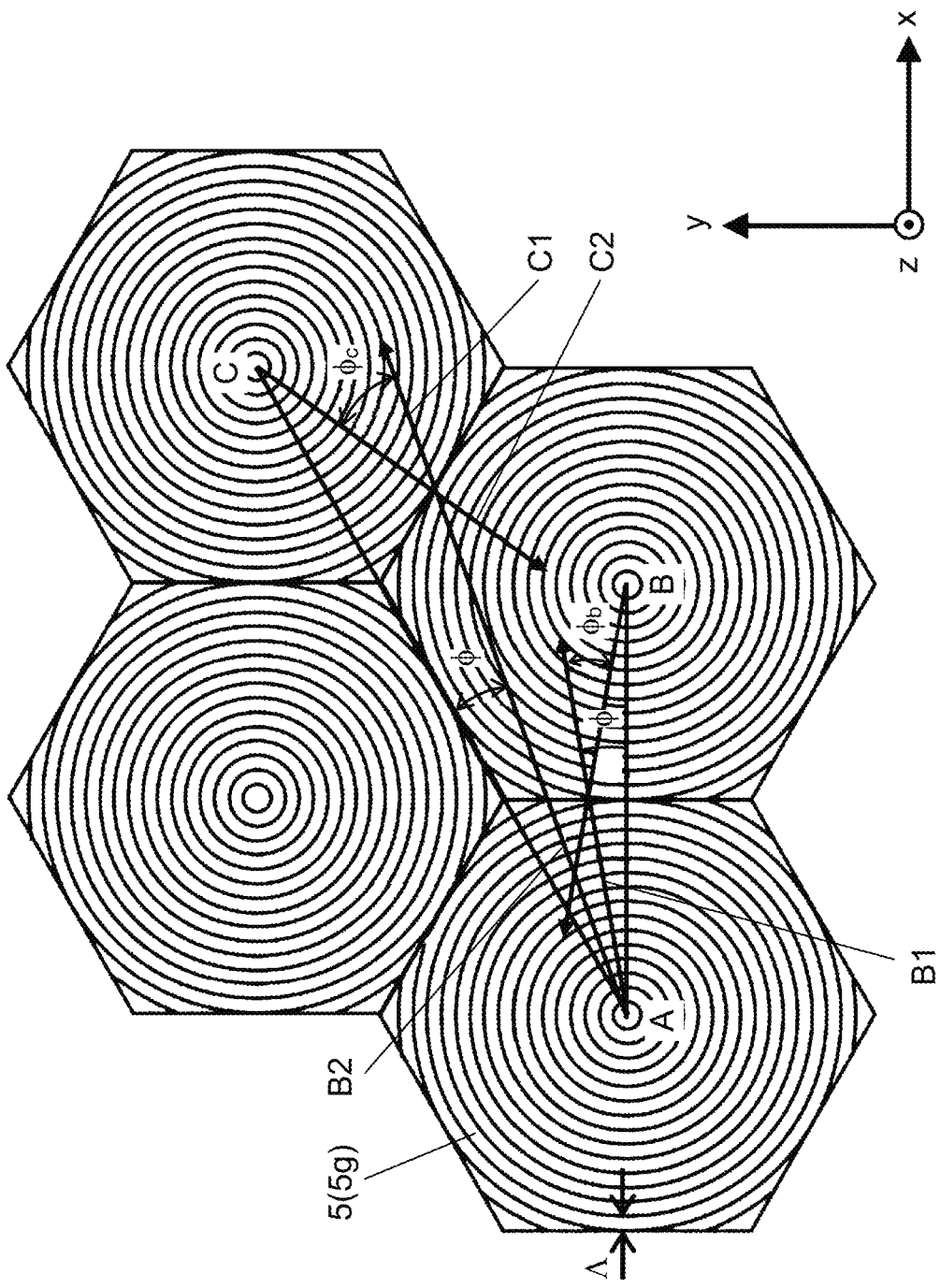

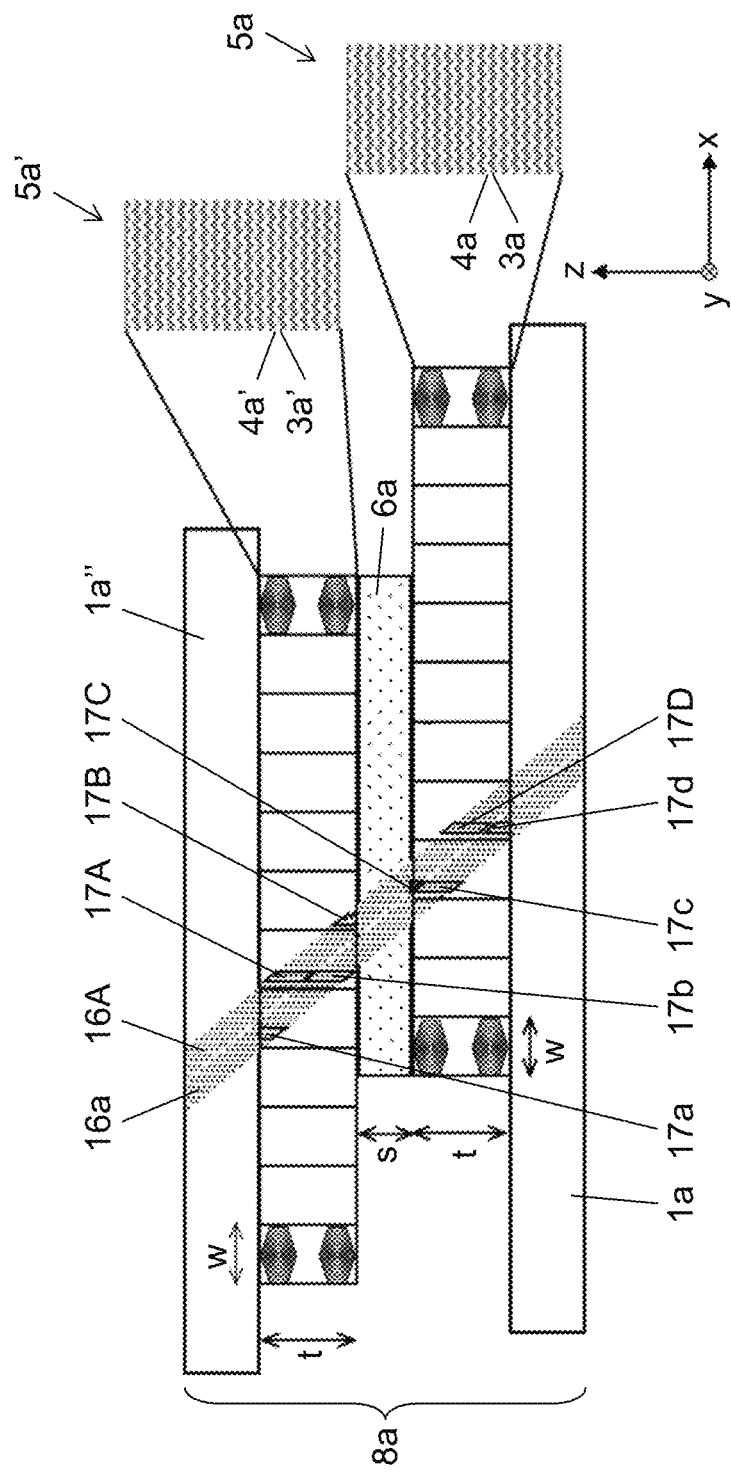

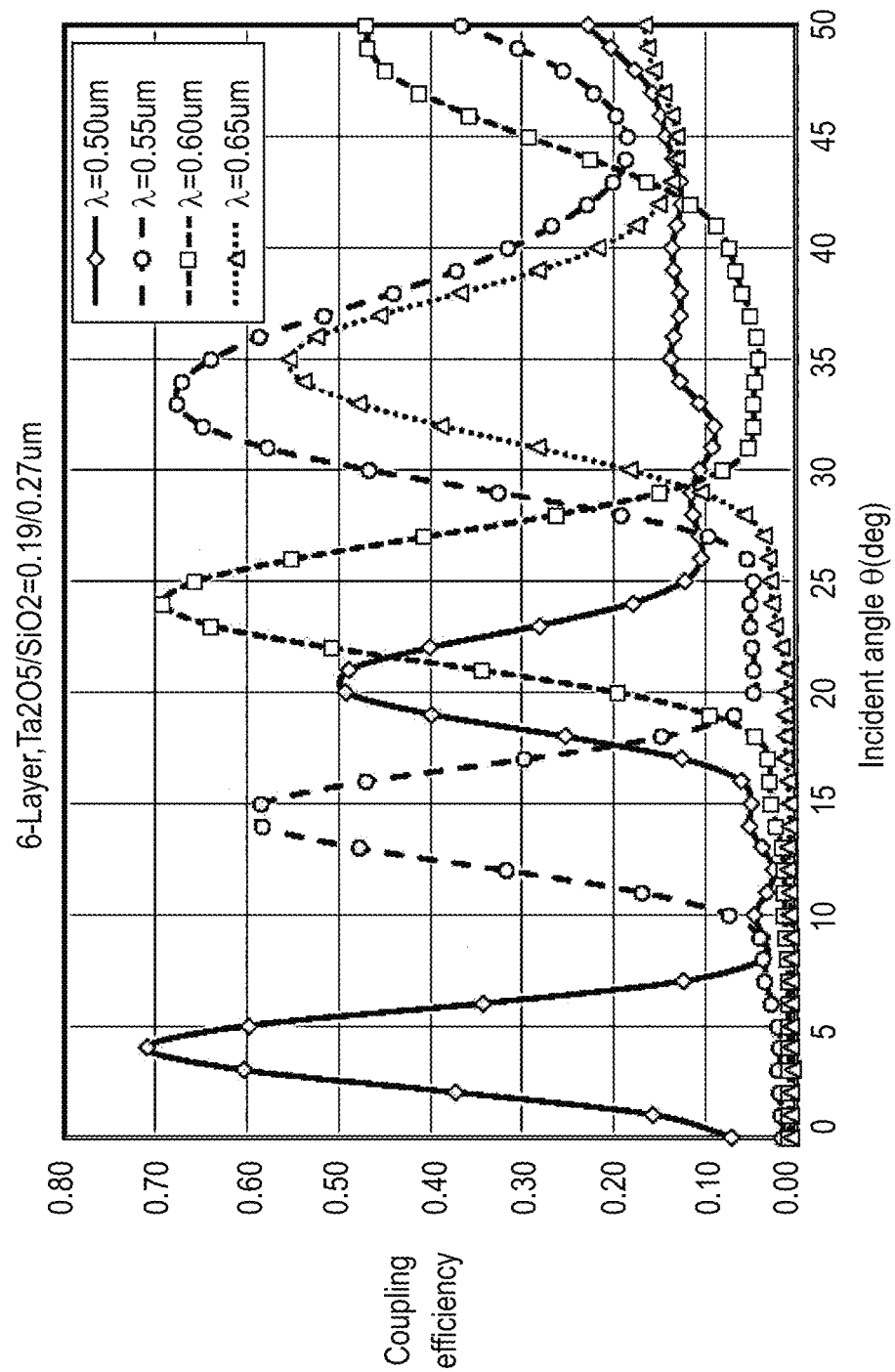

LIGHT-GUIDE SHEET AND PHOTOELECTRIC CONVERSION DEVICE

BACKGROUND

1. Technical Field

The present disclosure relates to a light-guide sheet that traps light by using diffraction and a photoelectric conversion device using the light-guide sheet.

2. Description of the Related Art

Patent Literature (PTL) 1 discloses a light-guide sheet that traps light by using diffraction of light. The light-guide sheet described in PTL 1 includes a light-transmissive sheet, and includes an optical coupling structure in the light-transmissive sheet. The optical coupling structure includes a first light-transmissive layer, a second light-transmissive layer, and a third light-transmissive layer sandwiched between the first light-transmissive layer and the second light-transmissive layer. Refractive indices of the first and second light-transmissive layers are lower than a refractive index of the light-transmissive sheet. A refractive index of the third light-transmissive layer is higher than the refractive indices of the first and second light-transmissive layers. The third light-transmissive layer has a diffraction grating. This enables light having a wide wavelength range to be taken in at a wide incident angle.

PTL 1 is International Publication No. WO2012/046414.

SUMMARY

The present disclosure provides a light-guide sheet that takes in incident light and waveguides the incident light in a direction intersecting with an incident direction of the incident light inside the light-guide sheet. The light-guide sheet easily holds, inside the light-guide sheet, the incident light that has been taken into the light-guide sheet. The present disclosure also provides a photoelectric conversion device using the light-guide sheet.

A light-guide sheet according to the present disclosure is a light-guide sheet that takes in incident light and waveguides light in a direction intersecting with an incident direction of the incident light inside the light-guide sheet. The light-guide sheet includes: a lower refractive index layer; a light-transmissive layer that is continuously stacked with the lower refractive index layer and has a refractive index that is higher than a refractive index of the lower refractive index layer; and a diffraction grating that is disposed on the light-transmissive layer and changes a travelling direction of the incident light. A pattern of the diffraction grating is divided into a plurality of partial patterns on the light-transmissive layer, and each of the plurality of partial patterns has a concentric circular shape or a concentric polygonal shape.

A photoelectric conversion device according to the present disclosure includes the above light-guide sheet, and a photoelectric conversion element that includes a light-receiving surface that receives the light and converts the light received by the light-receiving surface into power. The photoelectric conversion element is disposed around the light-guide sheet, and the light-receiving surface is located to face an end face of the light-guide sheet that is located in an axis intersecting with the incident direction of the incident light.

By employing the light-guide sheet according to the present disclosure, it is easy to hold, inside the light-guide sheet, light that has been taken into the light-guide sheet.

By employing the photoelectric conversion device according to the present disclosure, the light-guide sheet can take in incident light from the outside over a wide area of the light-guide sheet, and the taken incident light can be efficiently guided to the photoelectric conversion element that is disposed on a side of the end face of the light-guide sheet. This enables photoelectric conversion to be efficiently performed on the incident light.

BRIEF DESCRIPTION OF DRAWINGS

FIG. 1B is a plan view of a portion of the photoelectric conversion device illustrated in FIG. 1A.

FIG. 1C is a sectional view of the photoelectric conversion device illustrated in FIG. 1A.

Parts (a) and (b) of FIG. 2 are schematic perspective views for explaining a structure of a light-guide sheet according to a first exemplary embodiment. Part (c) of FIG. 2 is a schematic sectional view for explaining the light-guide sheet according to the first exemplary embodiment and a propagation path of light.

Figure 3:
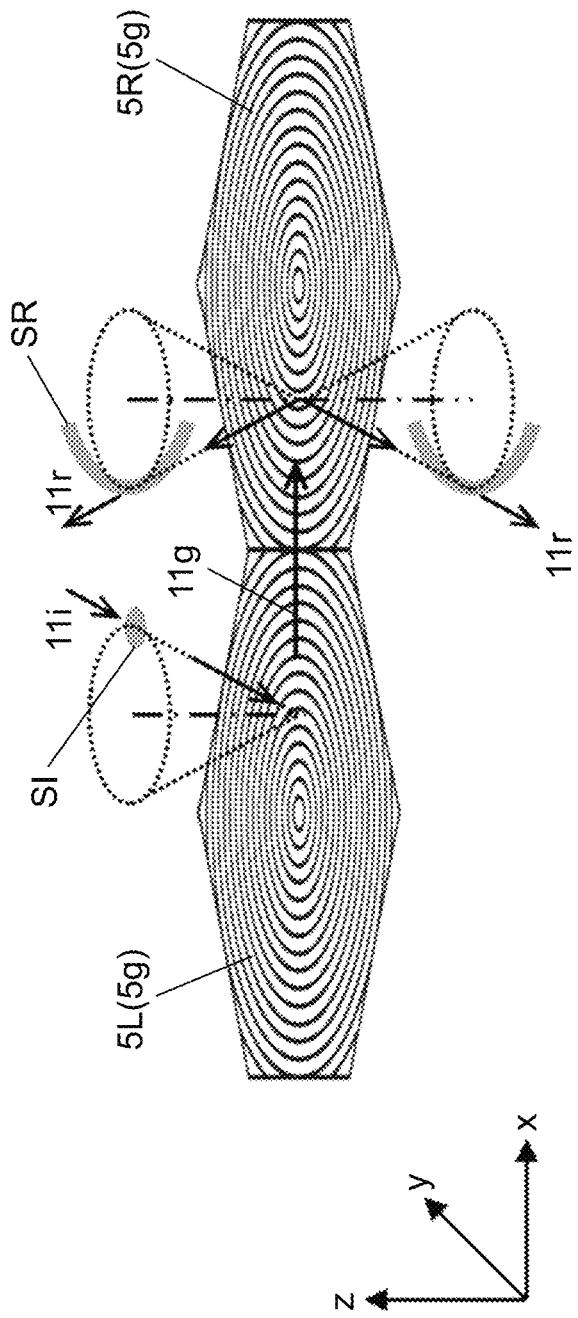

FIG. 3 is a schematic perspective view for explaining an optical coupling structure and a propagation path of light inside the light-guide sheet according to the first exemplary embodiment.

FIG. 4A is a plan view illustrating a relationship between an optical coupling structure and an optical coupling orientation inside the light-guide sheet according to the first exemplary embodiment.

Figure 4B:
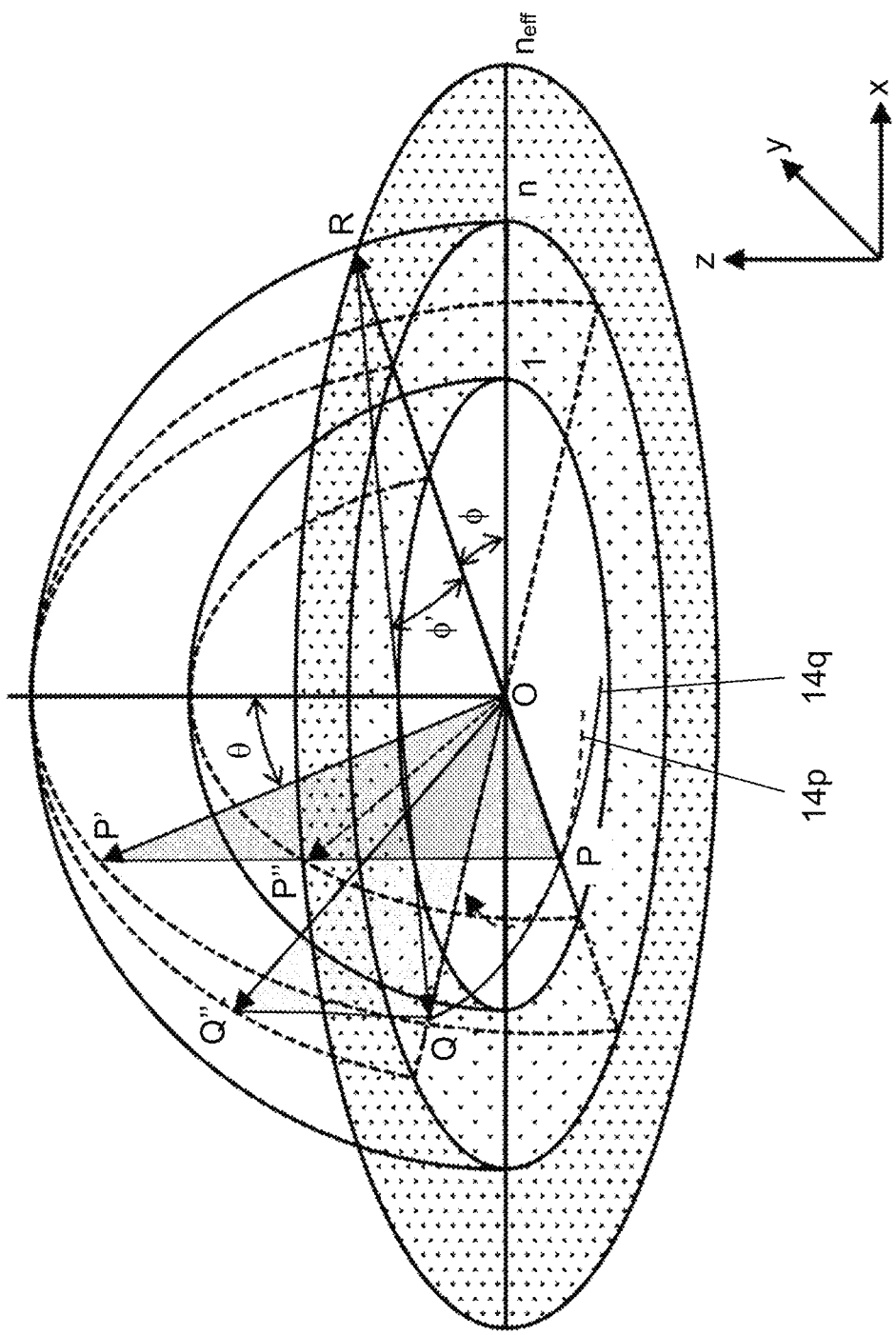

FIG. 4B is an explanatory diagram using a three-dimensional vector diagram, and illustrates a relationship among an incident vector, a waveguide vector, a grating vector, and an emission vector.

Figure 4C:
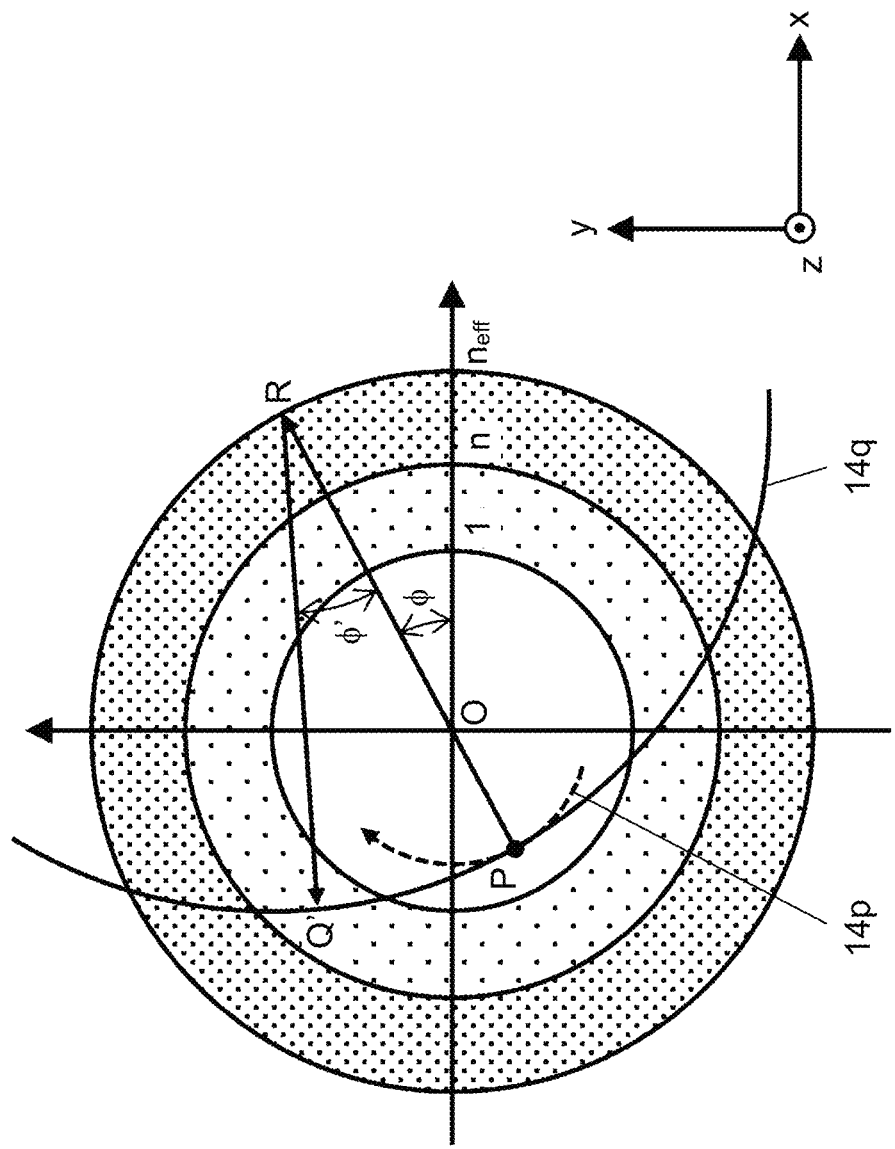

FIG. 4C is an explanatory diagram using a two-dimensional vector diagram, and illustrates a relationship among an incident vector, a waveguide vector, a grating vector, and an emission vector.

Figure 5:
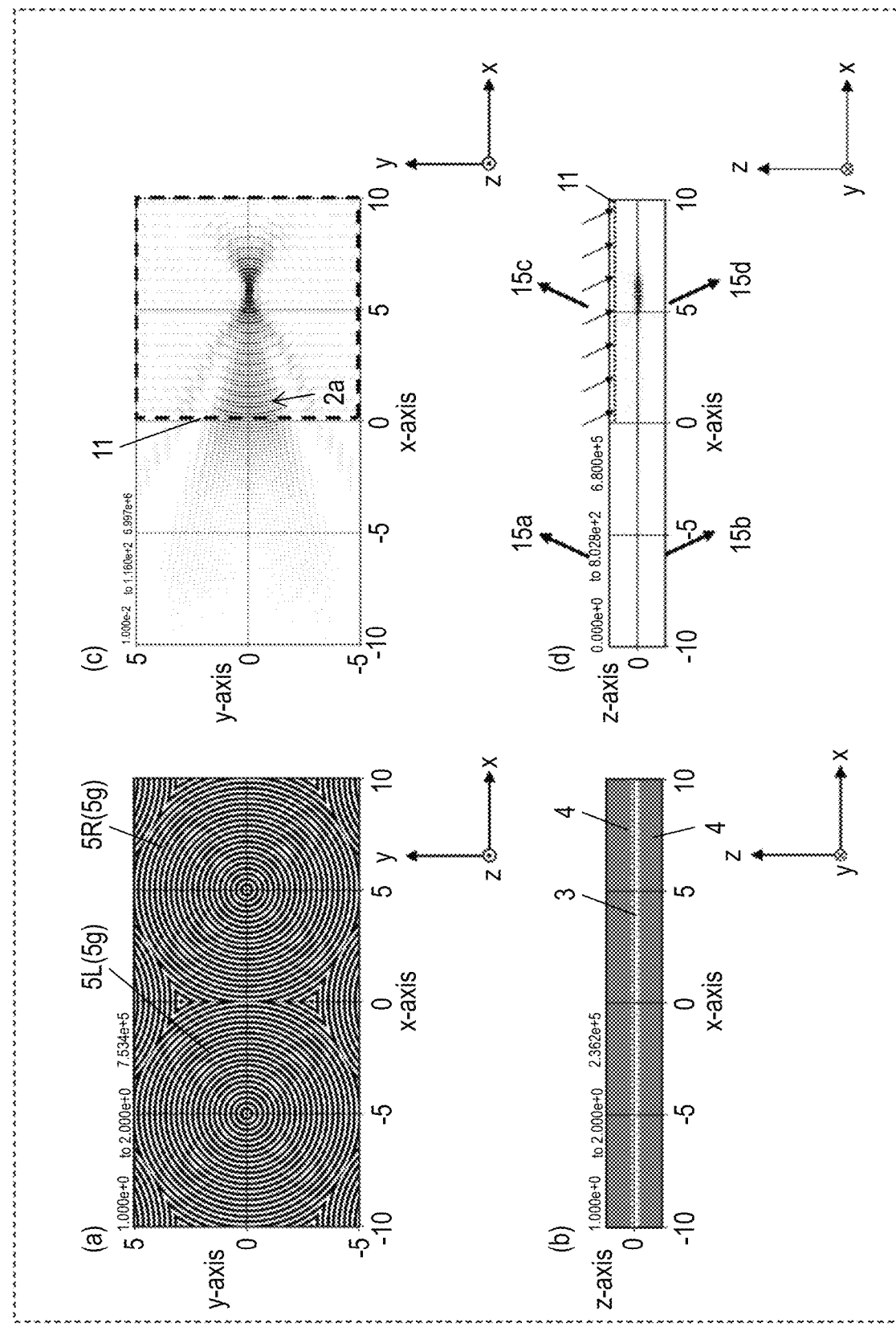

Parts (a) and (b) of FIG. 5 are respectively a plan view and a sectional view of an optical coupling structure inside a light-guide sheet according to the first exemplary embodiment that was used in electromagnetic analysis. Parts (c) and (d) of FIG. 5 are respectively a plan view and a sectional view that illustrate input light, guided waves, and a state of emission. In parts (c) and (d) of FIG. 5, a light intensity distribution obtained as a result of electromagnetic analysis has been superimposed.

Figure 6:
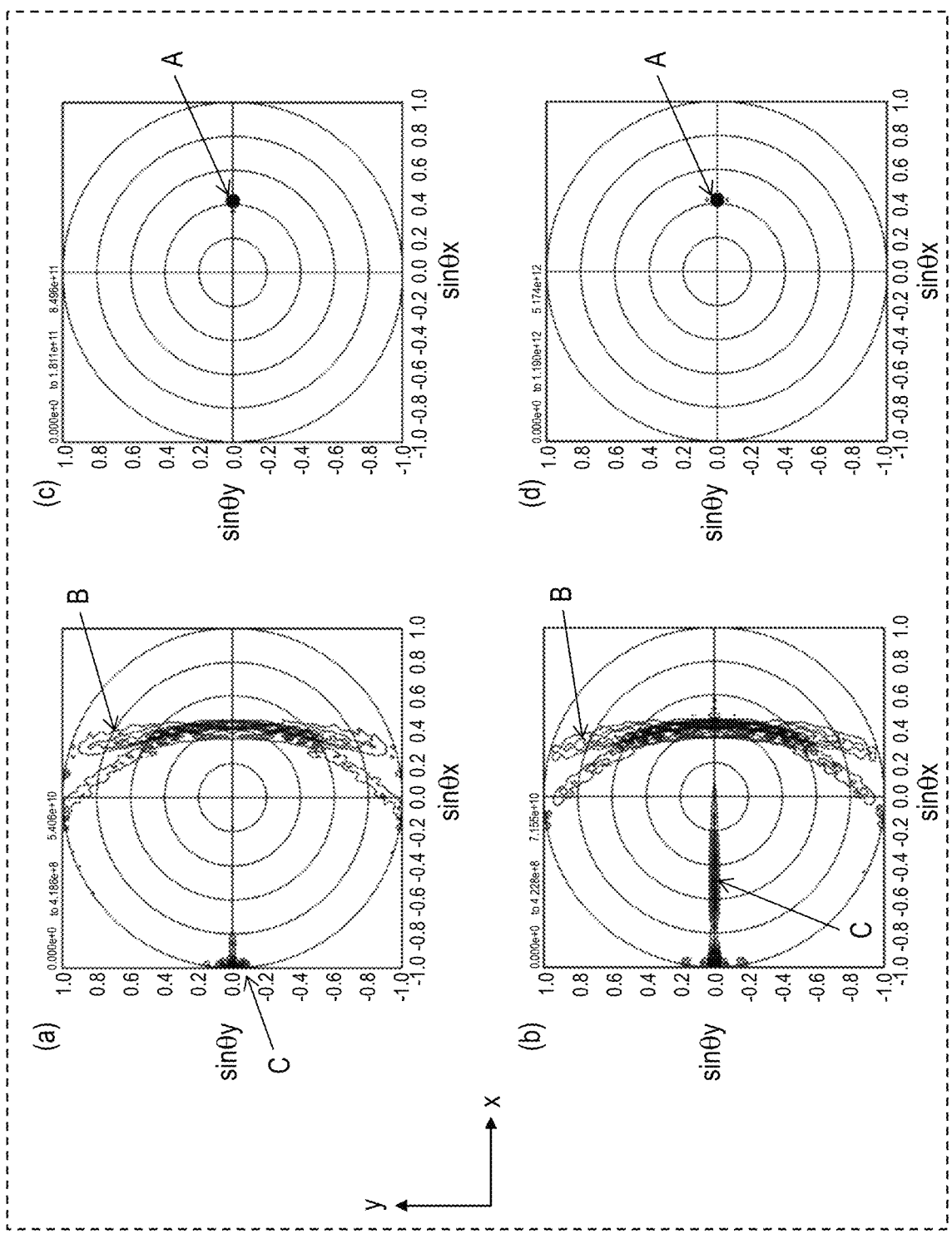

All of parts (a), (b), (c), and (d) of FIG. 6 are intensity distribution diagrams illustrating directivity of a far field of light.

FIG. 7A is a schematic sectional view for explaining an optical coupling structure and an incident path of light inside a light-guide sheet according to the first exemplary embodiment.

Figure 7B:
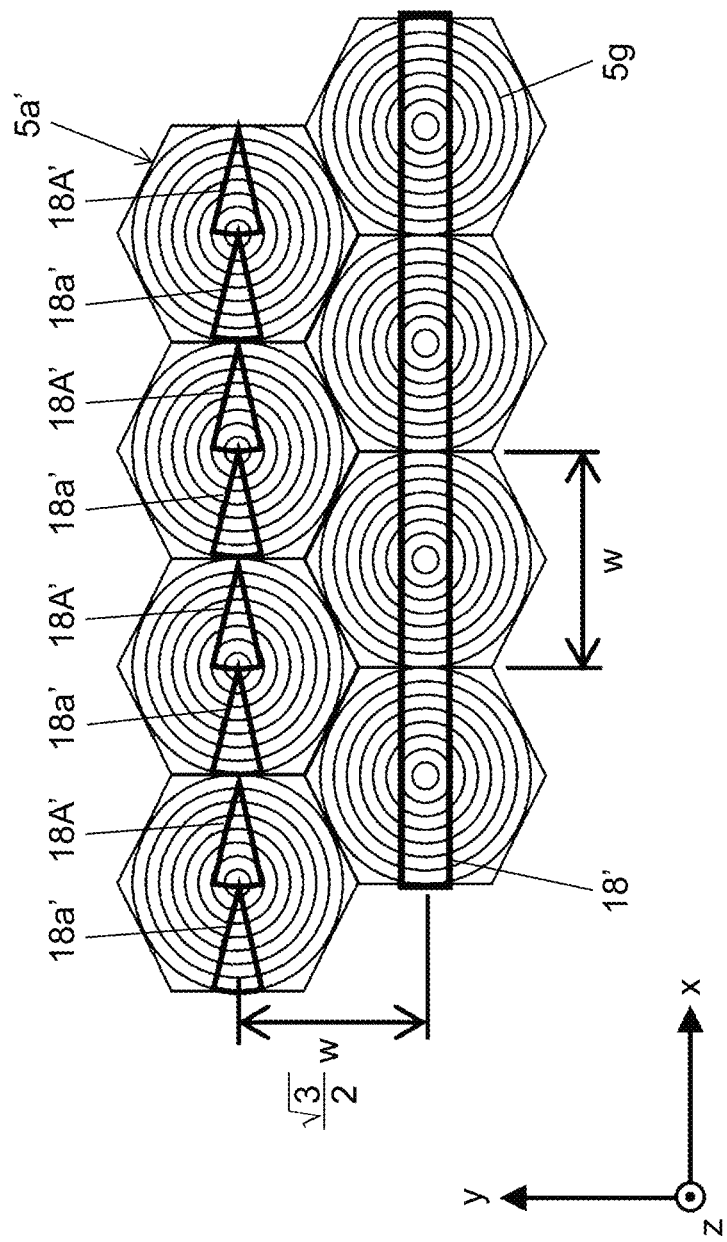

FIG. 7B is a plan view illustrating a relationship between an optical coupling structure and a coupling area.

Figure 7C:
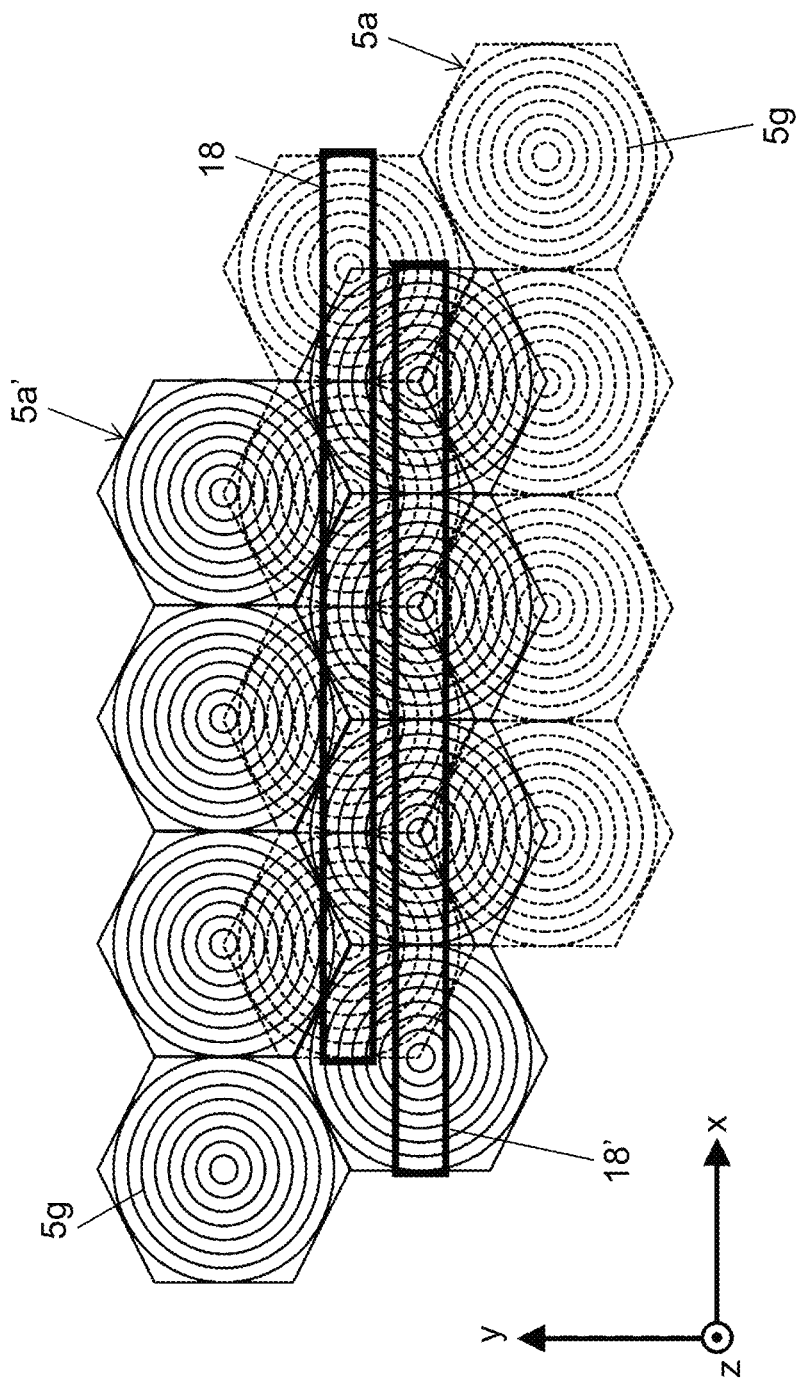

FIG. 7C is a plan view illustrating a relationship between optical coupling structures and coupling areas on upper and lower sides in a case where optical coupling layers have been made to overlap each other to be misaligned by a half cycle.

Figure 8A:
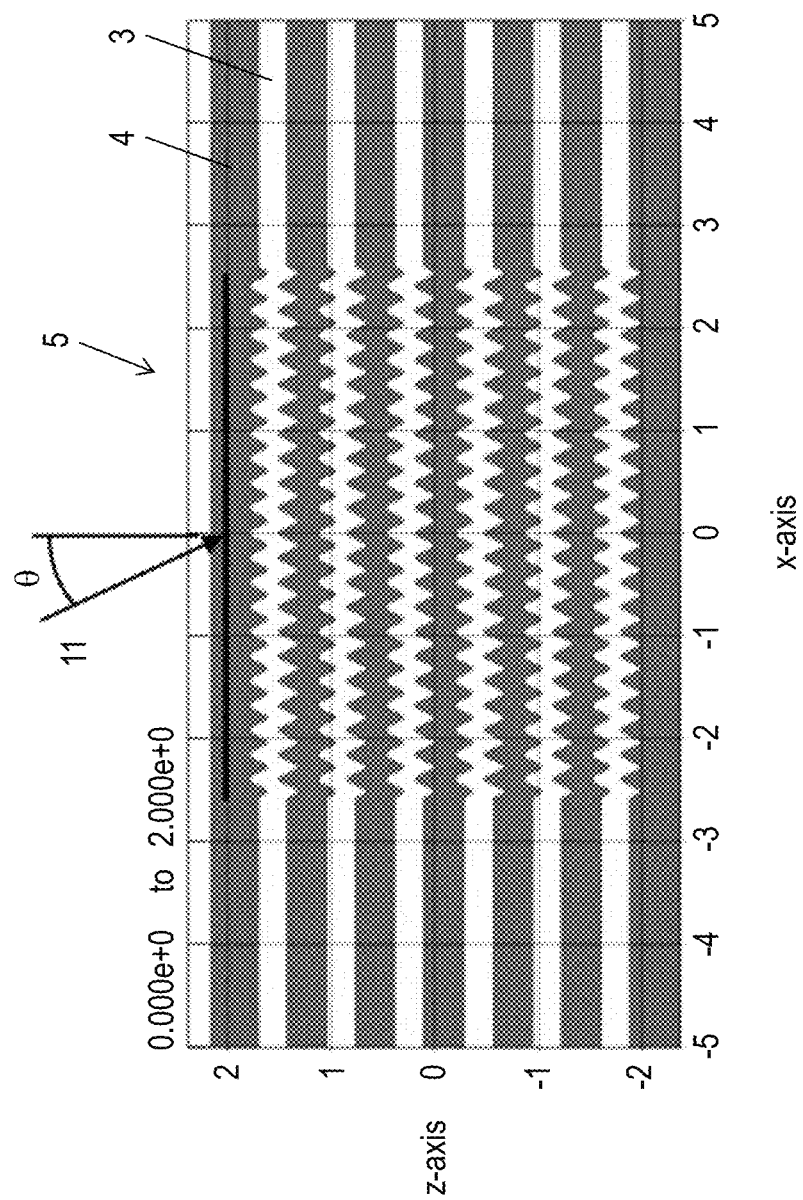

FIG. 8A is an explanatory sectional view of a two-dimensional analysis model illustrating a state of light that enters a six-layer optical coupling layer in order to explain angular dependence of optical input efficiency according to the first exemplary embodiment.

FIG. 8B is an explanatory diagram illustrating angular dependence of efficiency of inputting light to an optical coupling layer by using a wavelength as a parameter.

Figure 9:
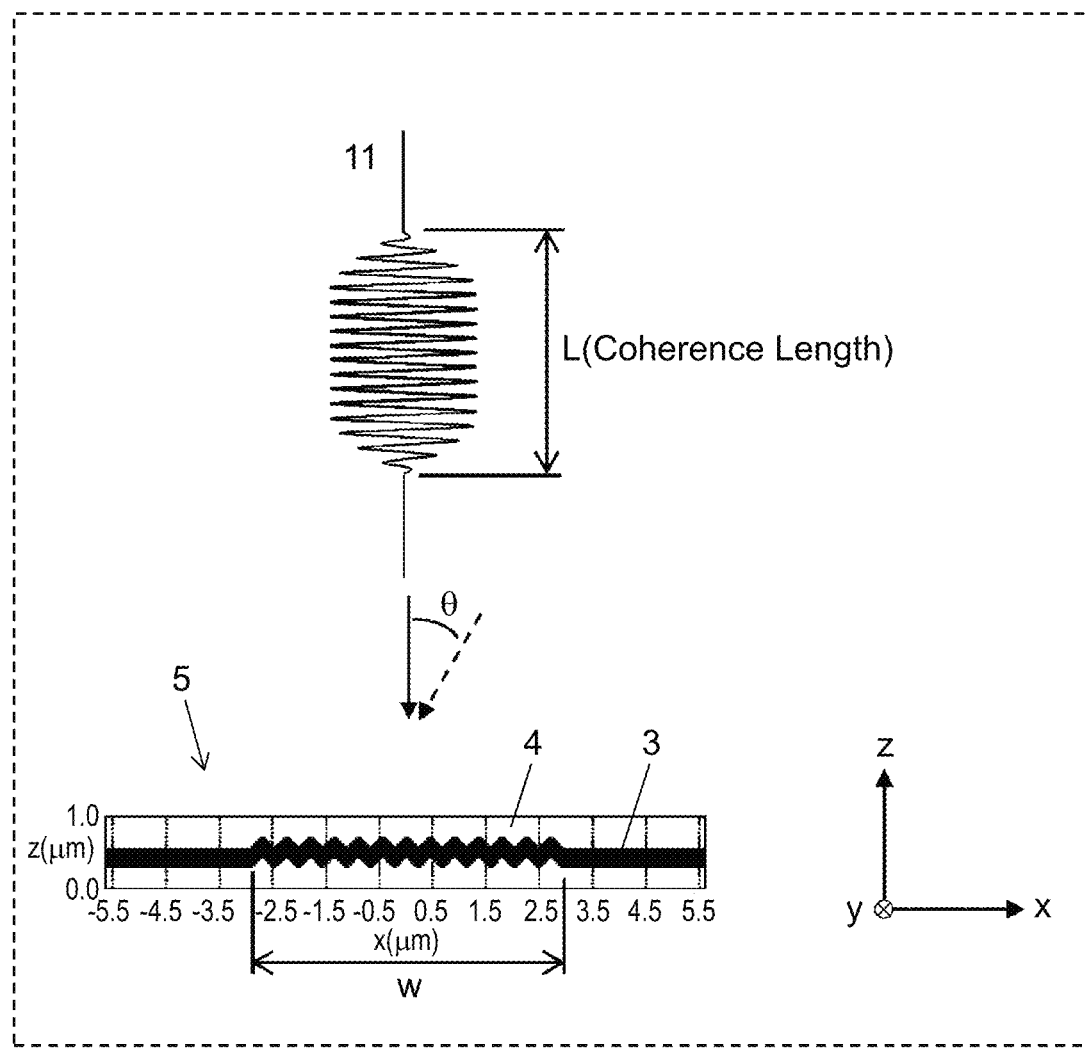

FIG. 9 is an explanatory diagram for explaining a single optical coupling layer according to the first exemplary embodiment and a coherence length of light that enters the optical coupling layer.

Figure 10A:
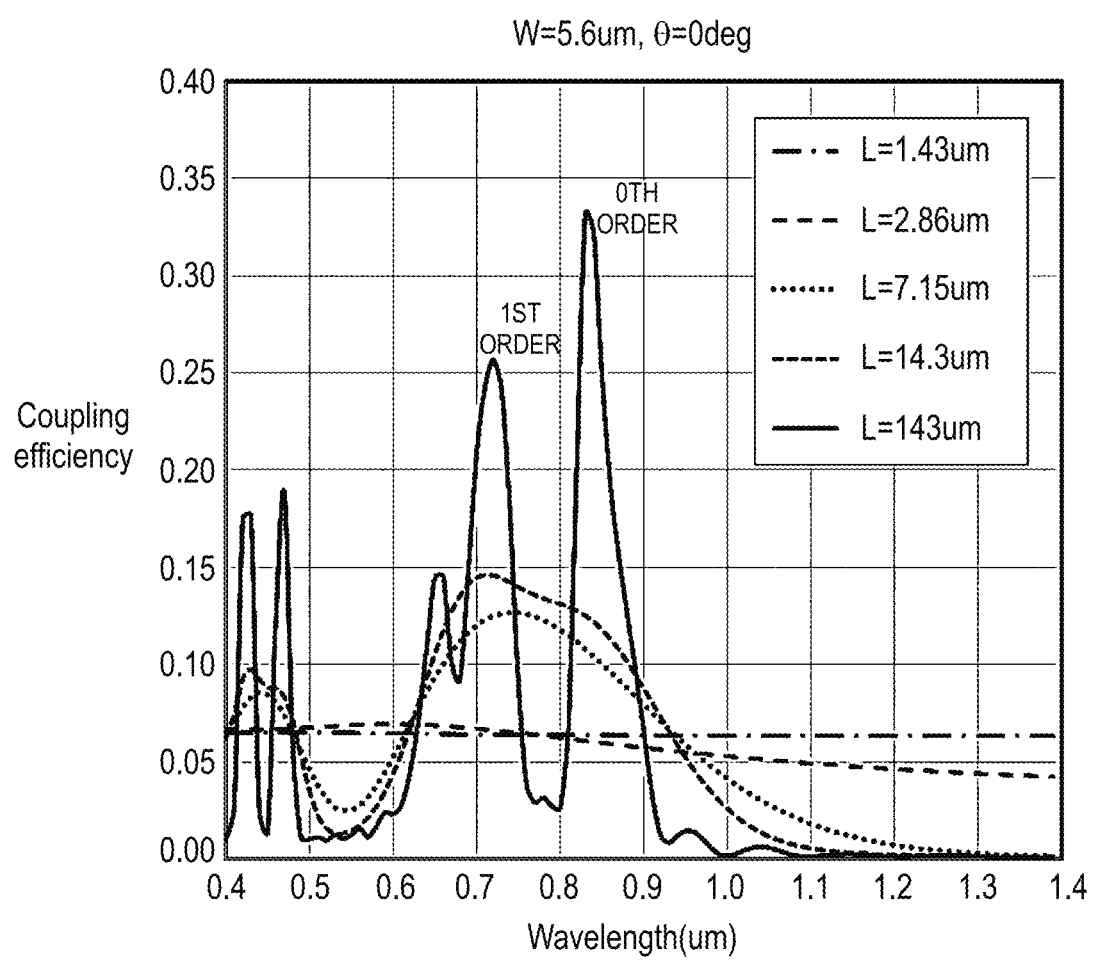

FIG. 10A is an explanatory diagram illustrating wavelength dependence of efficiency of inputting light to the optical coupling layer illustrated in FIG. 9.

Figure 10B:
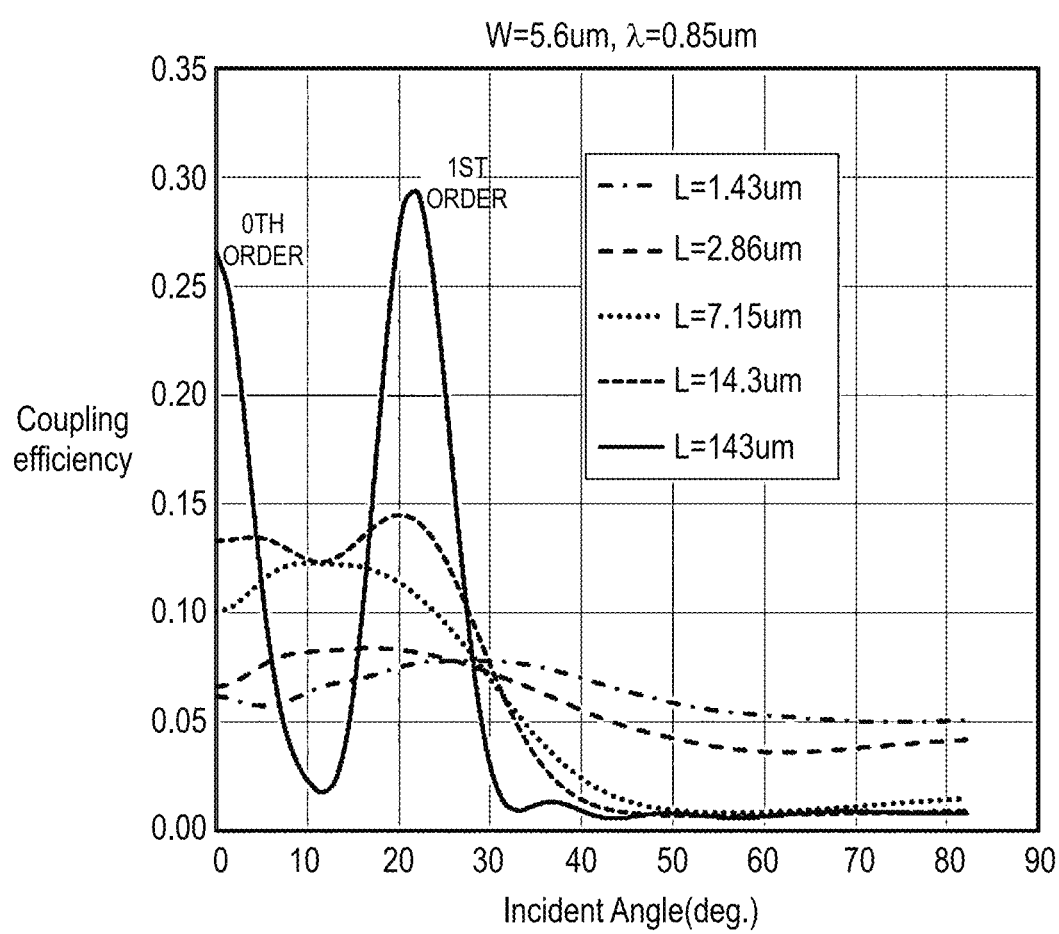

FIG. 10B is an explanatory diagram illustrating angular dependence of the efficiency of inputting light to the optical coupling layer illustrated in FIG. 9.

Figure 11:
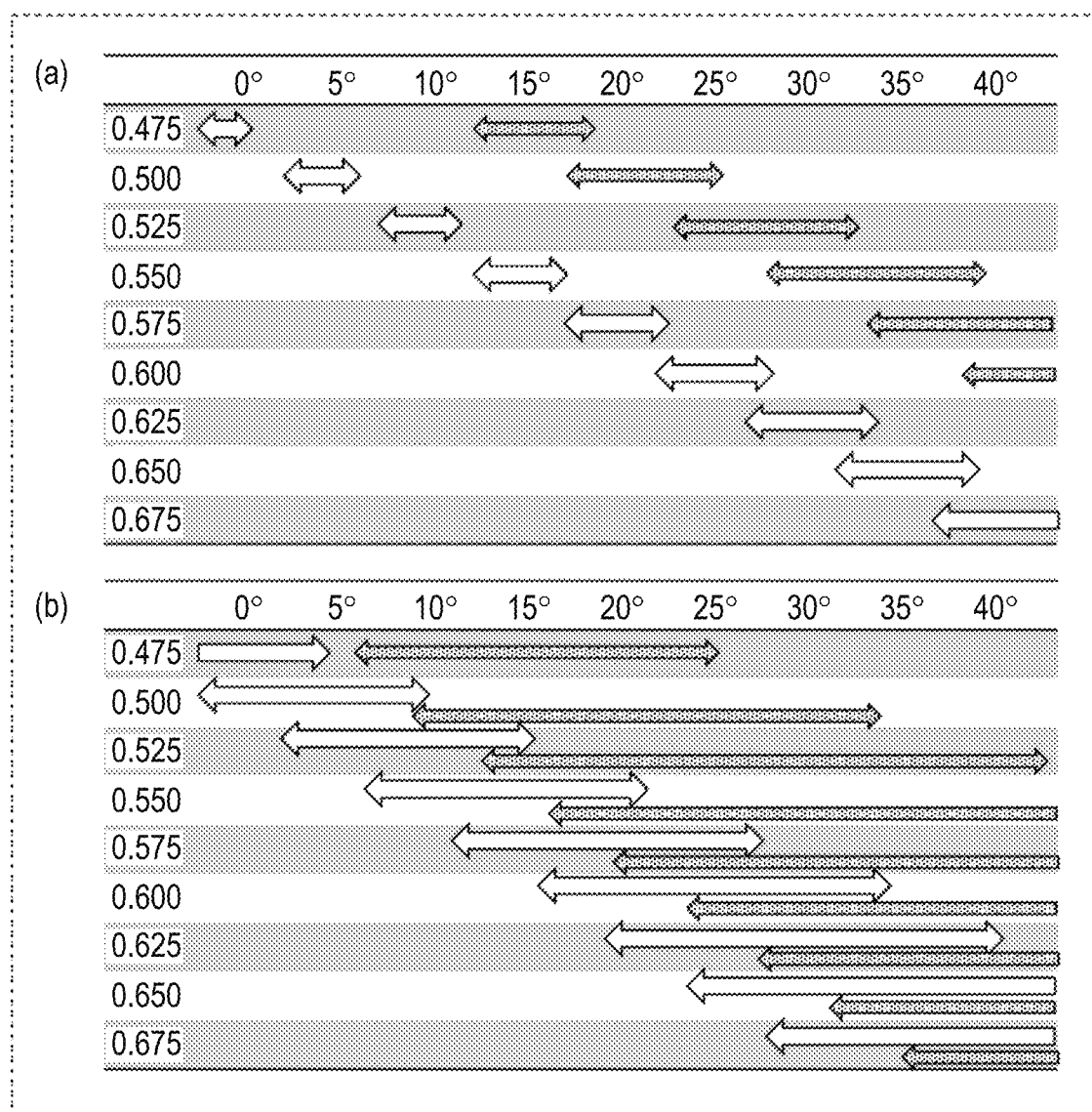

Part (a) of FIG. 11 is an explanatory diagram illustrating a coupling range with respect to a wavelength and an incident angle, and the coupling range is estimated on the basis of the result of FIG. 8B. Part (b) of FIG. 11 is an explanatory diagram illustrating a coupling range with respect to a wavelength and an incident angle in the case of incoherent light.

Figure 12:
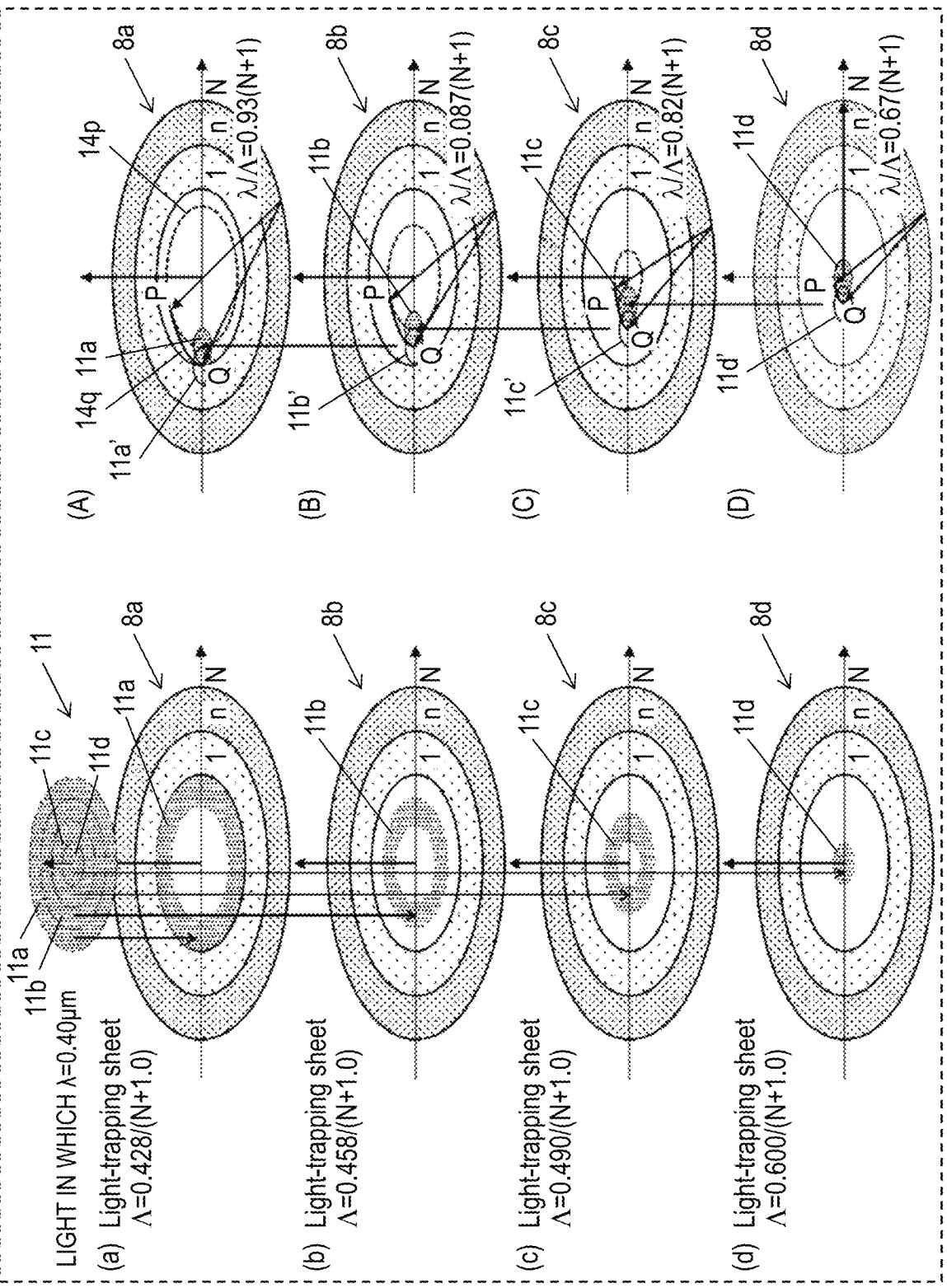

FIG. 12 is a perspective view explaining a process in which single-color incident light is coupled in an optical coupling layer, an angle is widened, the incident light is emitted, and the incident light becomes trapped light according to the first exemplary embodiment.

Figure 13:
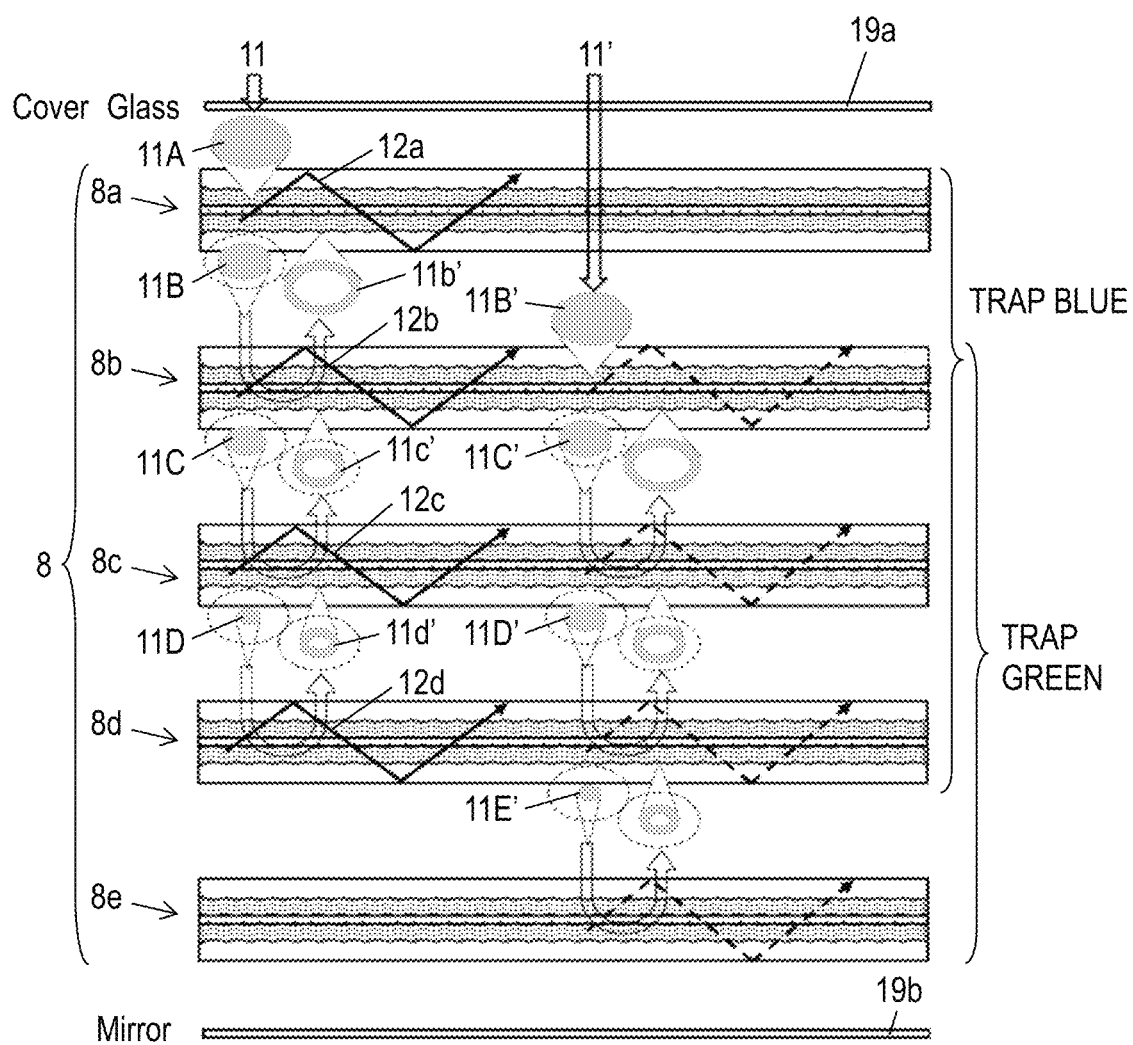

FIG. 13 is a sectional view explaining a process in which multi-color incident light is coupled in an optical coupling layer, an angle is widened, the incident light is emitted, and the incident light becomes trapped light according to the first exemplary embodiment.

Figure 14:
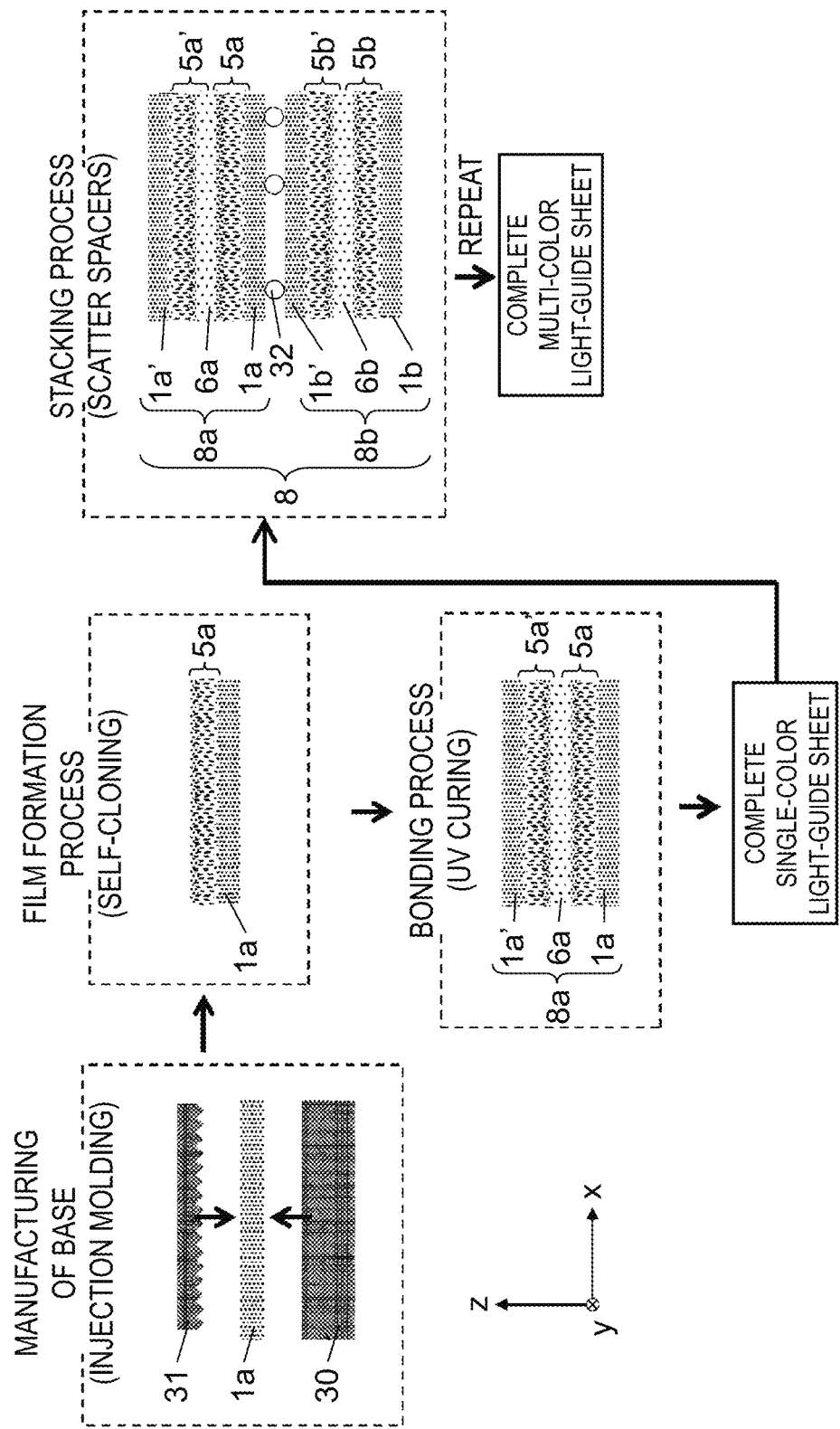

FIG. 14 is a schematic explanatory diagram illustrating an example of a procedure of manufacturing a light-guide sheet according to the first exemplary embodiment.

Figure 15:
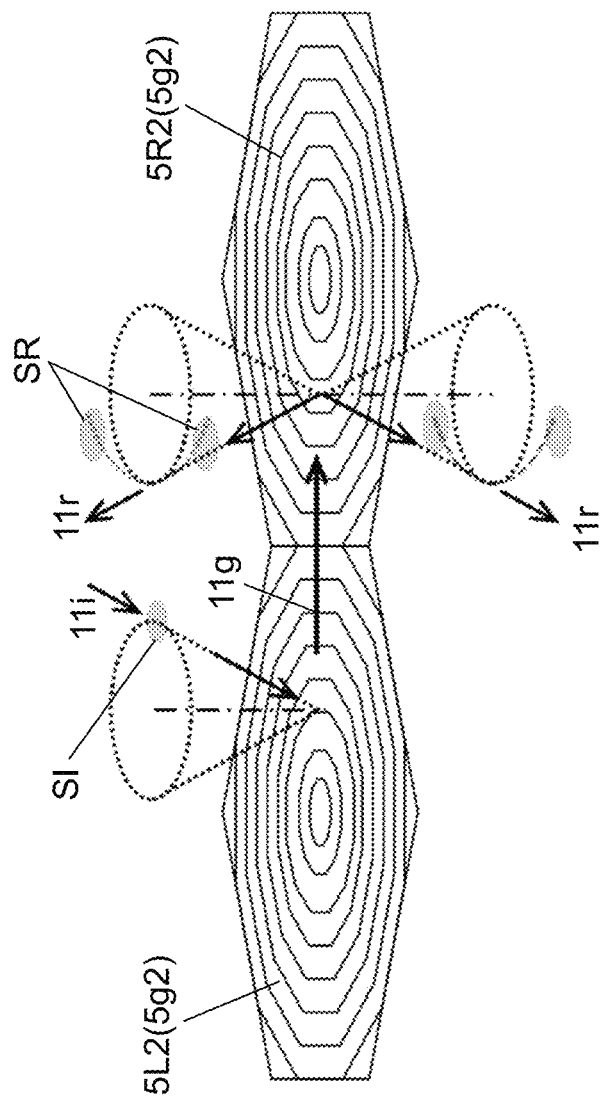

FIG. 15 is a schematic perspective view for explaining an optical coupling structure and a propagation path of light inside a light-guide sheet according to a second exemplary embodiment.

Figure 16:
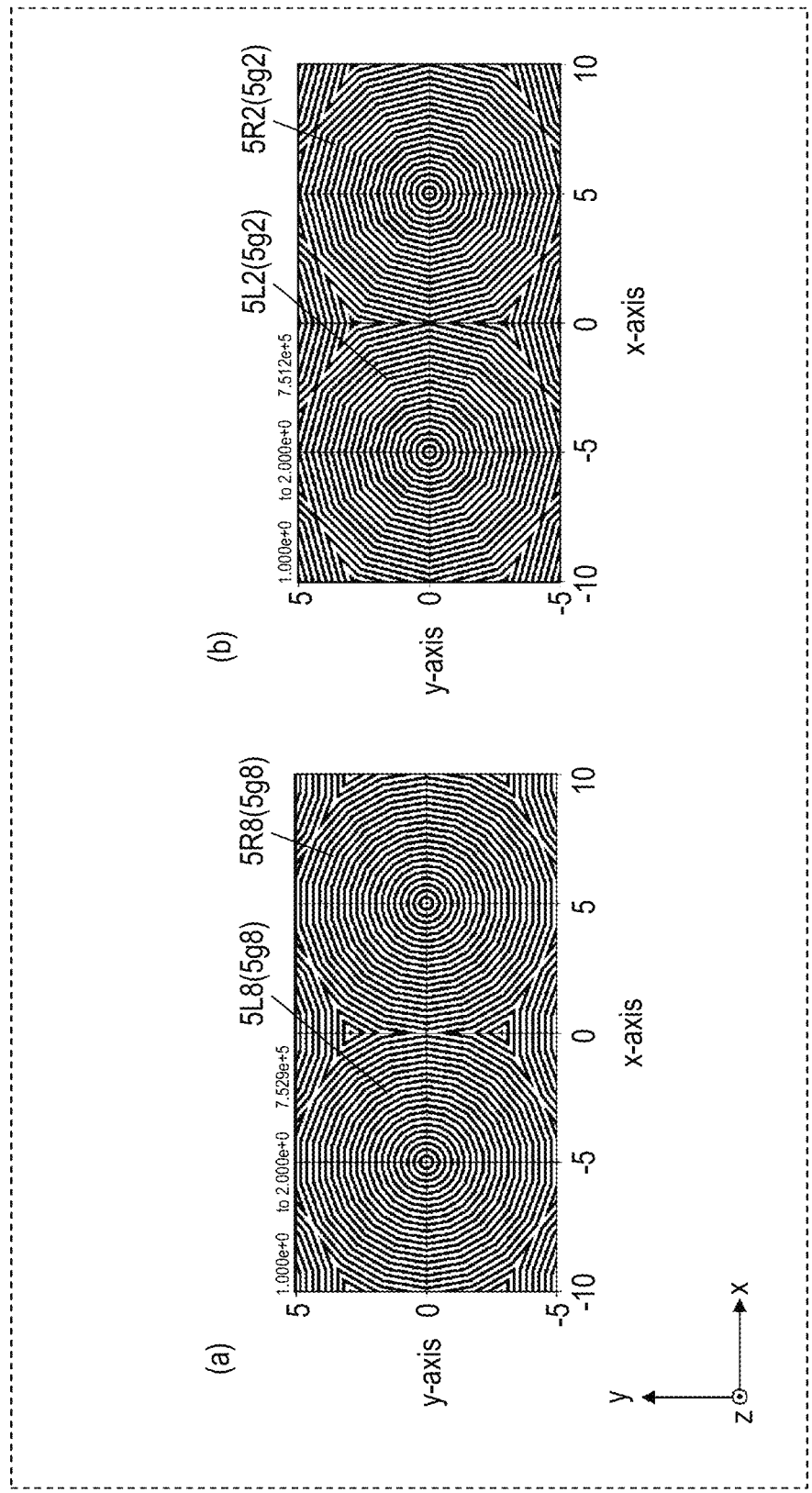

FIG. 16 is plan views of optical coupling structures inside light-guide sheets according to the second exemplary embodiment that were used in electromagnetic analysis. Part (a) is a plan view of a pattern of a grating having a concentric regular octadecagonal shape. Part (b) is a plan view of a grating having a concentric regular dodecagonal shape.

Figure 17:
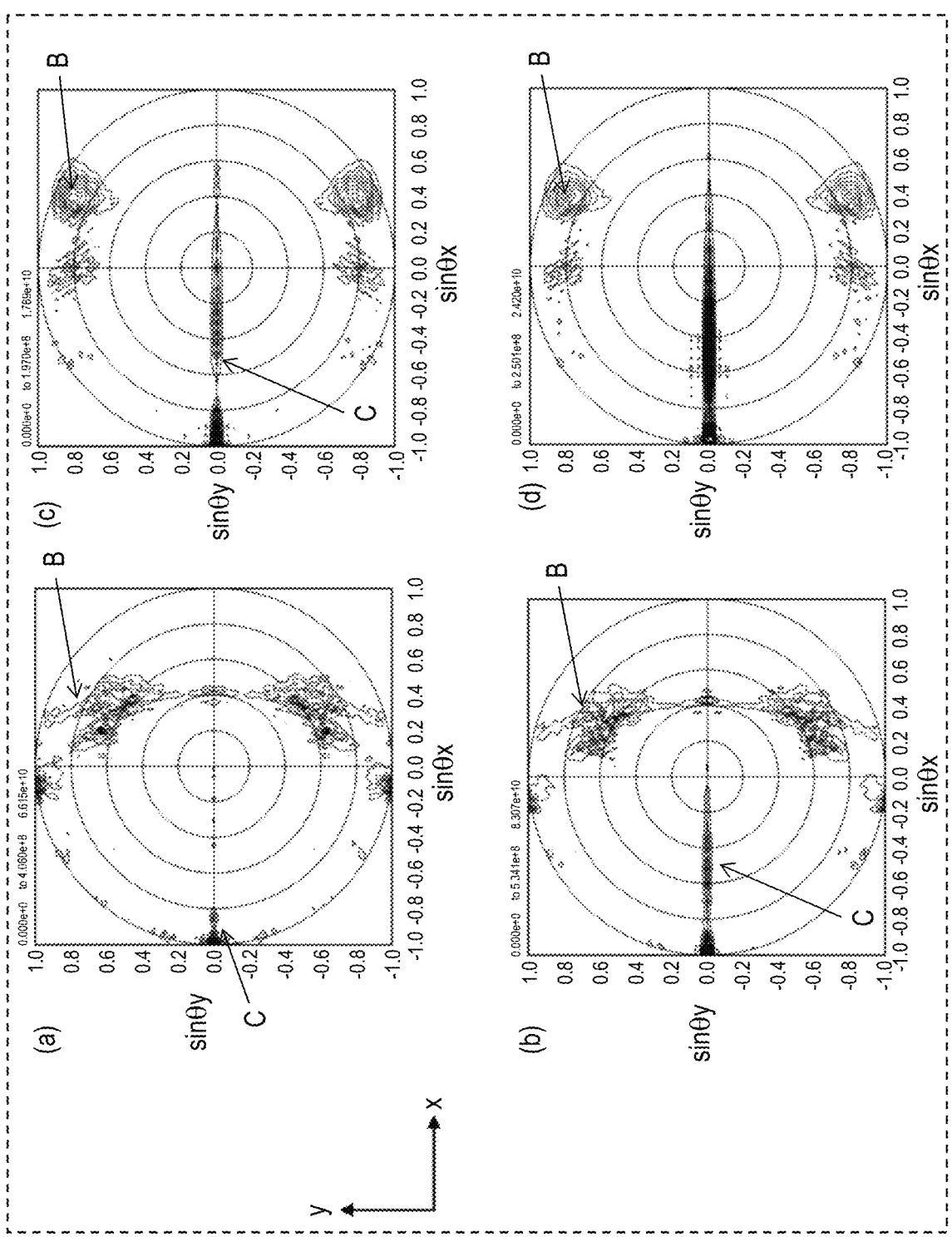

All of parts (a), (b), (c), and (d) of FIG. 17 are intensity distribution diagrams illustrating directivity of a far field of light. Parts (a) and (b) of FIG. 17 are far field distribution diagrams of radiated light in part (a) of FIG. 16. Parts (c) and (d) of FIG. 17 are far field distribution diagrams of radiated light in part (b) of FIG. 16.

Figure 18A:
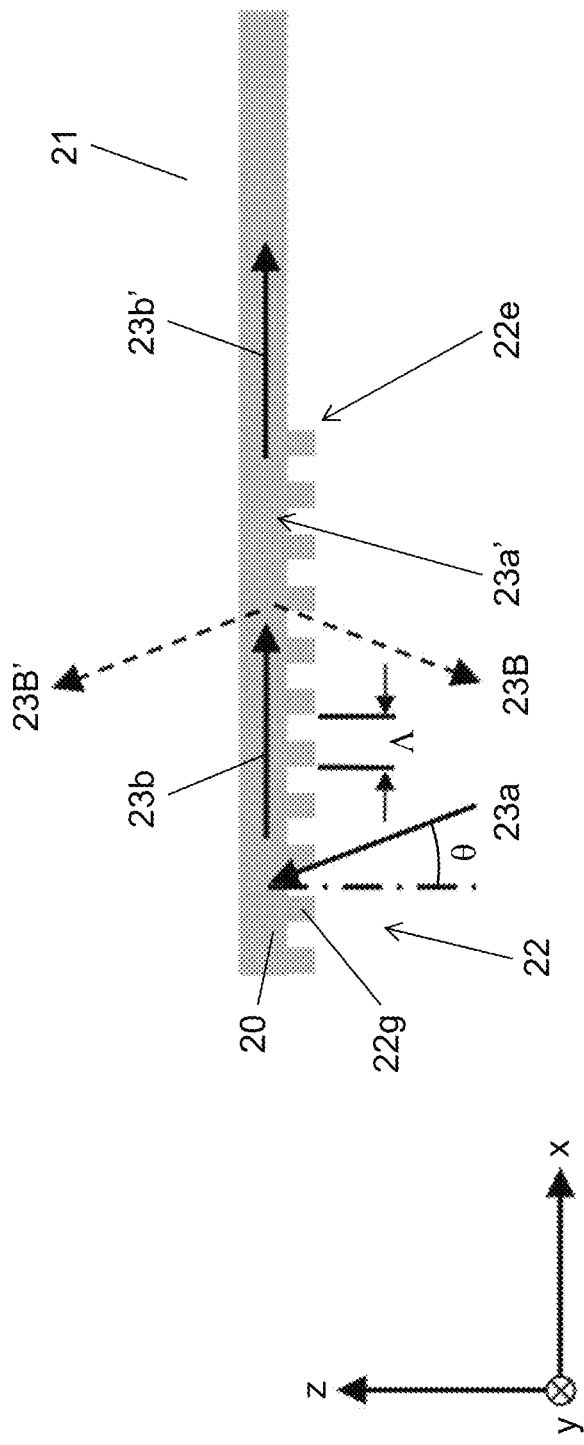

FIG. 18A is a sectional view of an optical coupling layer for explaining a principle of a grating coupling method.

Figure 18B:
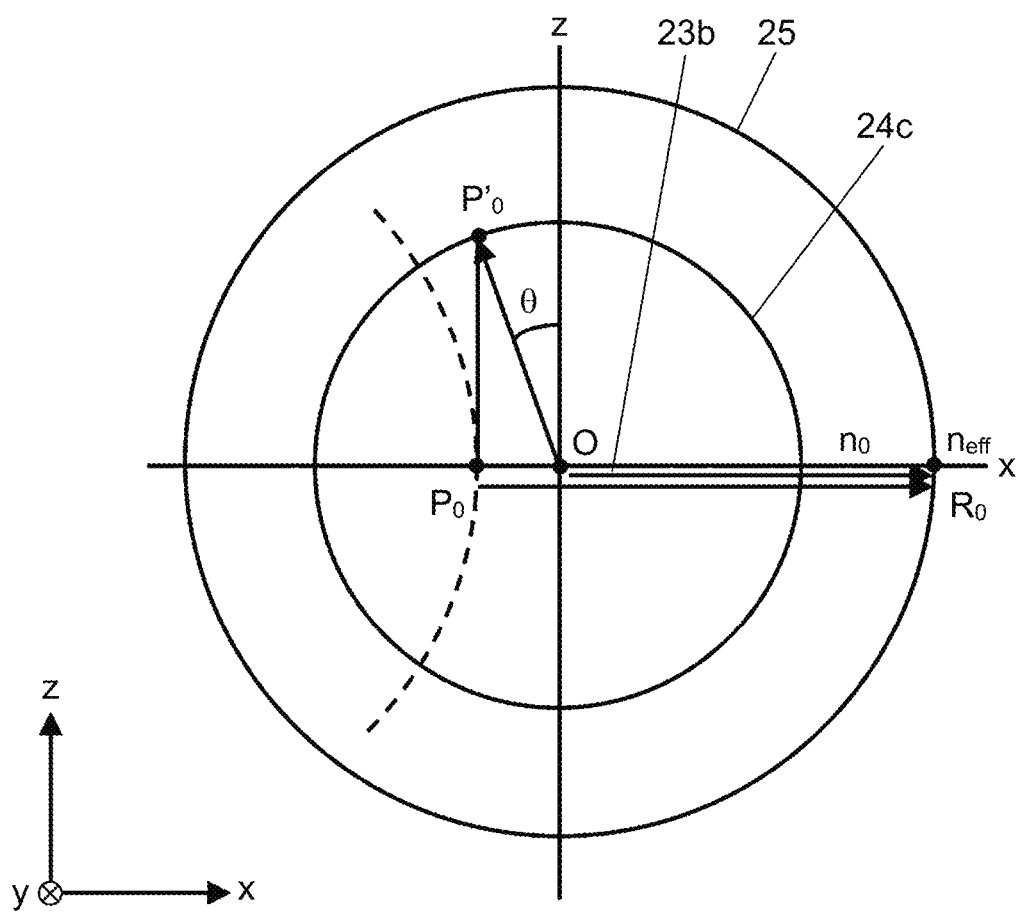

FIG. 18B is a diagram using a two-dimensional vector diagram for explaining the principle of the grating coupling method.

Figure 18C:
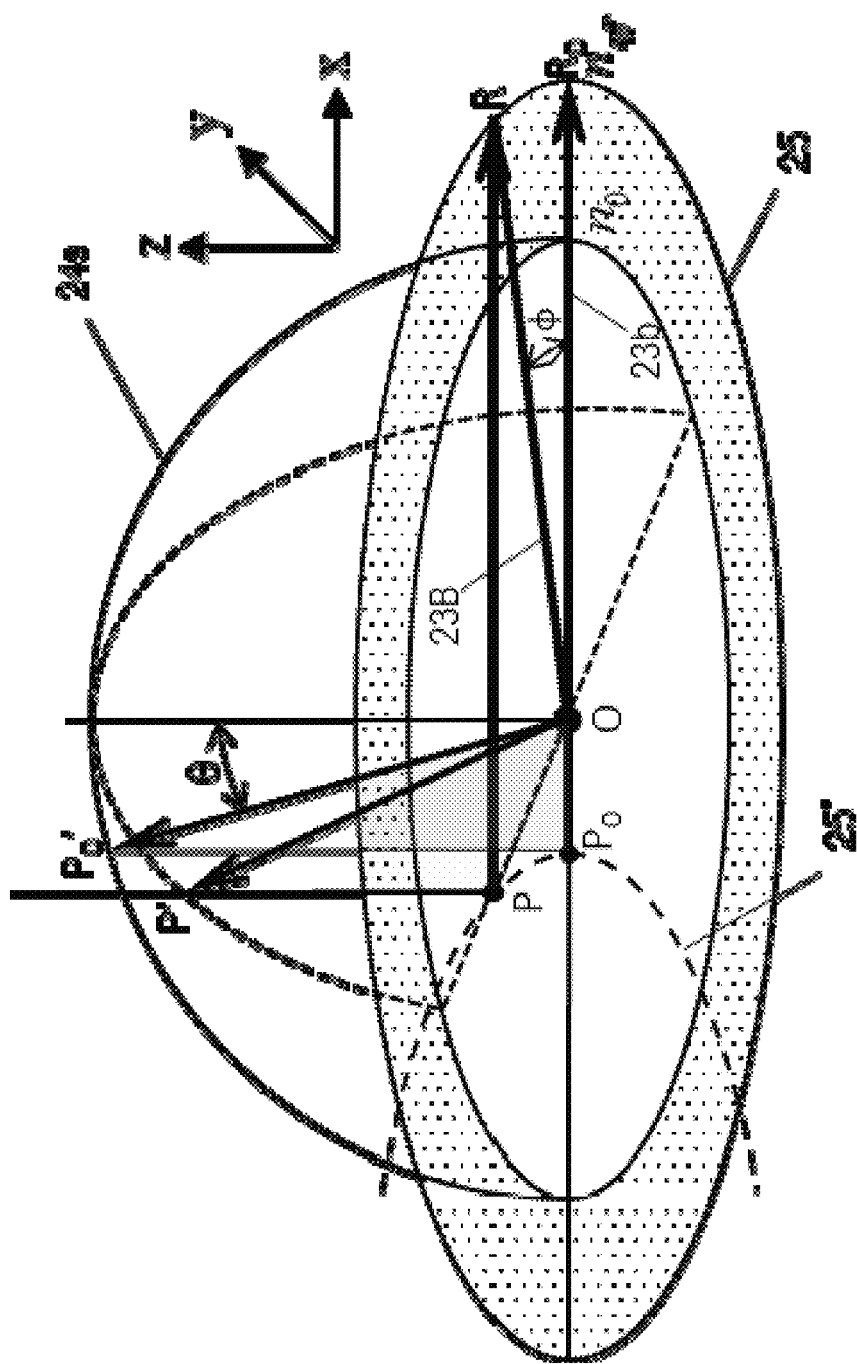

FIG. 18C is a diagram using a three-dimensional vector diagram for explaining the principle of the grating coupling method.

Figure 18D:
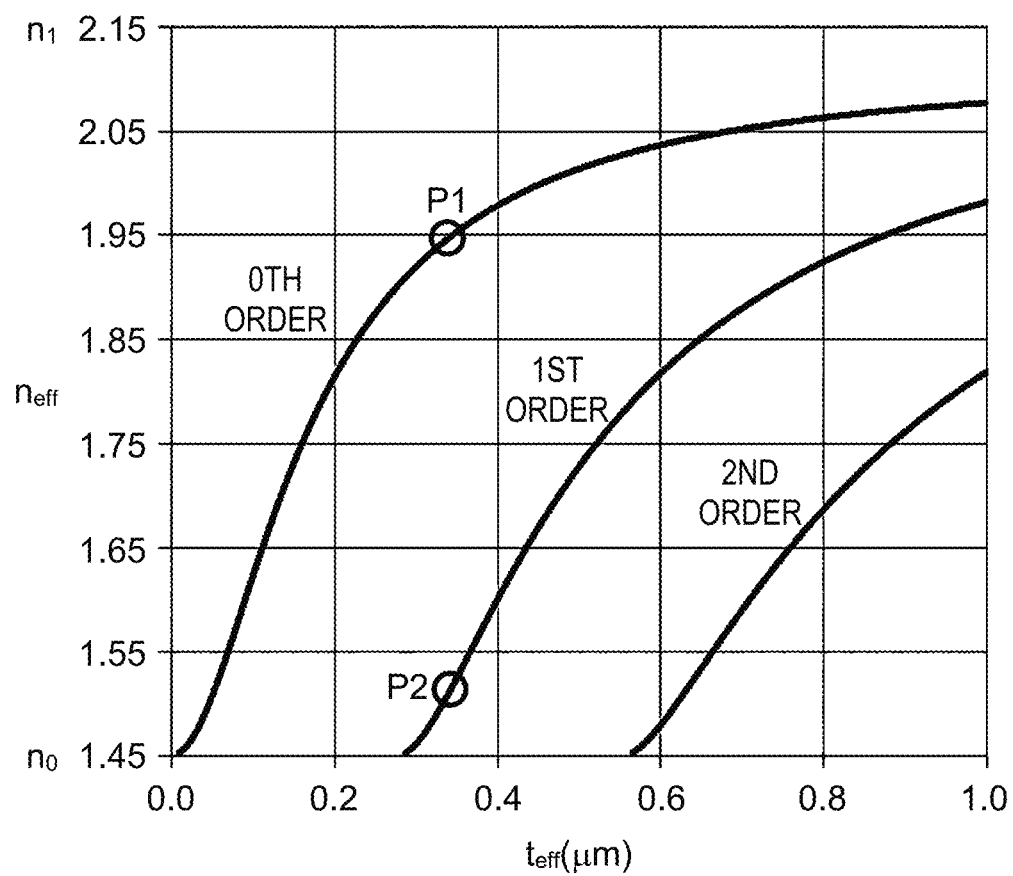

FIG. 18D is a diagram illustrating a relationship between an effective thickness and an effective refractive index of an optical coupling layer for explaining the principle of the grating coupling method.

DETAILED DESCRIPTION (Knowledge Underlying the Present Disclosure)

First, a viewpoint of the inventors is described below.

Light is an elementary particle that continuously propagates at light speed. It is generally difficult to transfer light to a single light propagation medium and hold the light inside the light propagation medium. An example of a conventional technique for taking light from an environmental medium such as the air into a transparent sheet is a grating coupling method.

FIGS. 18A to 18D are diagrams for explaining a principle of the grating coupling method.

Specifically, FIG. 18A is a sectional view along xz-axes of light-transmissive layer 20 that is provided with a straight-line grating (diffraction grating 22g) on a surface. The straight-line grating (diffraction grating 22g) has diffraction grating pitch Λ. The surface of light-transmissive layer 20 is parallel to an xy-plane, an orientation of the grating extends along a y-axis, and a grating vector of the grating is parallel to an x-axis.

Light-transmissive layer 20 provided with diffraction grating 22g is referred to as a grating coupler. Hereinafter, light-transmissive layer 20 provided with diffraction grating 22 is referred to as optical coupling layer 22. As illustrated in FIG. 18A, when incident light 23a having wavelength λ is made incident at predetermined incident angle θ with respect to a normal of a surface of optical coupling layer 22, incident light 23a can be coupled to waveguided light 23b that propagates in optical coupling layer 22.

FIG. 18B is an explanatory diagram illustrating a two-dimensional vector diagram of incident light 23a of FIG. 18A. In FIG. 18B, circle 24c and circle 25 are circles that respectively have a radius of refractive index no and a radius of effective refractive index $n_{eff}$ with point O as a center. Point $R_0$ is an intersection point of circle 25 and the x-axis. Here, refractive index $n_0$ is a refractive index of environmental medium 21 that is located around light-transmissive layer 20, and effective refractive index $n_{eff}$ is an effective refractive index of waveguided light 23b. Point $P_0'$ is an intersection point of a line drawn from point O along incident angle θ (an inclination angle with respect to a z-axis) and circle 24c. Point $P_0$ is a foot of a perpendicular drawn from point P to an xy-plane (an intersection point of the perpendicular and the x-axis).

FIG. 18D illustrates a relationship (dispersion characteristics) between effective thickness $t_{eff}$ and effective refractive index $n_{eff}$ in a case where waveguided light 23b propagates in a transverse electric (TE) mode. Effective refractive index $n_{eff}$ depends on an effective thickness of optical coupling layer 22, and has a specified value between refractive index no of environmental medium 21 and refractive index $n_1$ of light-transmissive layer 20 in accordance with a waveguide mode of propagating light that propagates in optical coupling layer 22. The effective thickness is a thickness itself of light-transmissive layer 20 in a case where diffraction grating 22g is absent. In a case where diffraction grating 22g is present, the effective thickness is a sum of the thickness of light-transmissive layer 20 and an average height of diffraction grating 22g.

Note that FIG. 18D illustrates a relationship in a case where environmental medium 21 that covers a periphery of light-transmissive layer 20 is $SiO_2$ and light-transmissive layer 20 is $Ta_2O_5$. As illustrated in FIG. 18D, waveguided light that propagates in optical coupling layer 22 has a plurality of waveguide modes such as a 0th order mode, a 1st order mode, and a 2nd order mode, and the plurality of waveguide modes have characteristic curves different from each other.

Here, as illustrated in FIG. 18B, a condition for coupling light in a positive direction of the x-axis is that a length between $P_0$ and $R_0$ is equal to an integral multiple of a magnitude ($\lambda/\Lambda$) of a grating vector. Specifically, the condition for coupling light in the positive direction of the x-axis is expressed according to Equation (1) described below. In Equation (1), q is a diffraction order expressed by an integer.

[Equation 1]

$$n_0 \sin \theta = -n_{eff} + q\lambda/\Lambda \qquad (1)$$

Coupling of light only occurs in a case where wavelength $\lambda$, incident angle $\theta$, and the like satisfy Equation (1).

A case where an incident direction of incident light 23a is parallel to an xz-plane has been described above. A case where the incident direction is not parallel to the xz-plane is examined. FIG. 18C is an explanatory diagram illustrating a three-dimensional vector diagram of incident light 23a of FIG. 18A.

In FIG. 18C, spherical surface 24s and circle 25 are a spherical surface and a circle that respectively have a radius of refractive index no and a radius of effective refractive index $n_{eff}$ with point O as a center. Point $R_0$ is an intersection point of circle 25 and an x-axis.

Point $P_0'$ is an intersection point of a line drawn from point O along incident angle $\theta$ (an inclination angle with respect to a z-axis) and spherical surface 24s. Point $P_0$ is a foot of a perpendicular drawn from point $P_0'$ to an xy-plane (an intersection point of the perpendicular and the xy-plane).

The relationship described above is satisfied in a case where an incident direction of incident light 23a is parallel to an xz-plane, and all of points $P_0'$, $P_0$, $R_0$ are located on the xz-plane. In a case where incident light 23a is not parallel to the xz-plane, a line is drawn along an orientation of an incident ray of light from point O, and point P' at which the line intersects with spherical surface 24s is obtained. A foot of a perpendicular drawn from point P' to the xy-plane (an intersection point of the perpendicular and the xy-plane) is point P. A line is drawn from point P to be parallel to the x-axis, and point R that intersects with circle 25 is obtained. A condition for coupling light is that vector PR is equal to an integral multiple of a grating vector. It is assumed that a circle obtained by shifting circle 25 along the x-axis by an integral multiple of the grating vector is circle 25'. If point P is located on circle 25', the condition for coupling light is satisfied. If point P deviates from circle 25', the condition for coupling light is not satisfied.

Accordingly, in a case where incident light 23a is not parallel to the xz-plane, an angle changes at which incident light 23a is coupled to waveguided light, but an incident angle and a wavelength are still limited.

In addition, while waveguided light 23b propagates in an area of optical coupling layer 22, rays of light 23B, 23B' are emitted at the same angle as the incident angle. Accordingly, incident light 23a' that is made incident in a position close to grating end 22e of optical coupling layer 22 continues to propagate as waveguided light 23b' in light-transmissive layer 20. However, light that is made incident in a position away from end 22e is attenuated by a time when the light reaches end 22e. Stated another way, even when a condition for being coupled to waveguided light is satisfied, there is a problem in which light that can propagate in light-transmissive layer 20 is limited to light that has an incident position that is close to grating end 22e.

In view of the problem described above, the inventors have created the present disclosure.

Exemplary embodiments are described in detail below with reference to the drawings as appropriate. However, an unnecessarily detailed description may be omitted. For example, a detailed description of well-known matters or a duplicate description of substantially the same configuration may be omitted. This is to avoid unnecessary redundancy in the description below and to make the description below easily understandable to those skilled in the art.

Note that the inventors provide the accompanying drawings and the description below to help those skilled in the art to fully understand the present disclosure, and the inventors do not intend to use the accompanying drawings or the description below to limit the subject matter described in the claims.

It is assumed that an x-axis and a y-axis in respective drawings are axes that are orthogonal to a z-axis. It is also assumed that the x-axis is an axis that is orthogonal to the y-axis. In this description, a positive direction of the z-axis is defined as "above". In addition, a z-axis direction is written as a stacking direction in some cases.

In this description, the terms "above" and "below" do not indicate an upward direction (vertically above) and a downward direction (vertically below) in terms of absolute spatial recognition. In addition, the terms "above" and "below" are not only applied to a case where two components are spaced apart from each other and another component is present between the two components, but are also applied to a case where two components are disposed in close contact with each other and are adjacent to each other.

In this description, "parallel" includes "almost parallel", that is, a manufacturing error.

First Exemplary Embodiment

A first exemplary embodiment is described below with reference to FIGS. 1A to 13.

[Structure of Light-Guide Sheet]

Figure 1A:
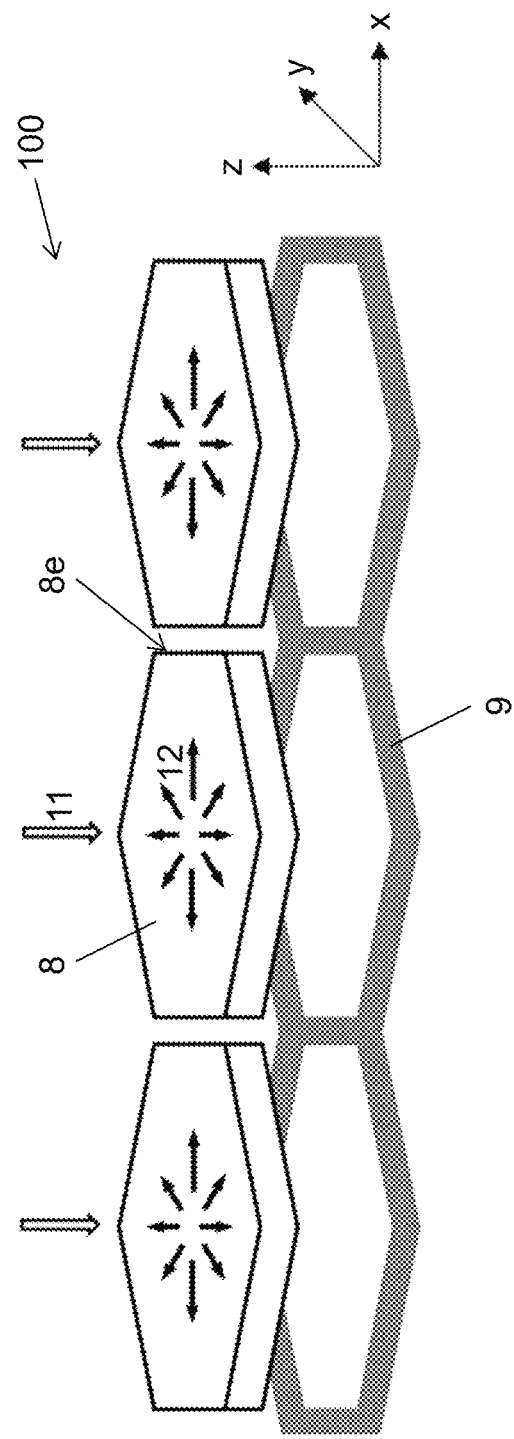
FIG. 1A is a perspective view illustrating a photoelectric conversion device according to the present disclosure.

FIG. 1A is a perspective view illustrating a photoelectric conversion device according to the present disclosure. FIG. 1B is a plan view of a portion of the photoelectric conversion device illustrated in FIG. 1A. FIG. 1C is a sectional view of the photoelectric conversion device.

As illustrated in FIGS. 1A to 1C, photoelectric conversion device 100 includes light-guide sheet 8 and photoelectric conversion element 9 that is disposed below a position of an end face of light-guide sheet 8. A shape on an xy-plane of light-guide sheet 8 is, for example, a regular hexagon, and photoelectric conversion element 9 has a regular hexagonal outer edge shape. Light-guide sheets 8 are spread all over the xy-plane to be adjacent to each other in a honeycomb shape, and photoelectric conversion elements 9 are disposed just below a honeycomb boundary.

Photoelectric conversion device 100 is a device that takes incident light 11, such as sunlight or illumination light, into light-guide sheet 8 and converts the taken incident light into power. In other words, incident light 11 is taken into light-guide sheet 8, and is converted into trapped light 12 inside light-guide sheet 8. Trapped light 12 propagates inside light-guide sheet 8, and reaches end face 8e of light-guide sheet 8. Trapped light 12 that has reached end face 8e is emitted from end face 8e, is reflected downward by mirror 10 that is disposed to be close to a position of the end face, is received by photoelectric conversion element 9, and is converted into power.

Photoelectric conversion element 9 converts the received light into power. A specific example of photoelectric conversion element 9 is a solar cell. As a material of photoelectric conversion element 9, for example, a semiconductor, such as crystalline silicon, monocrystalline silicon, or multicrystalline silicon, is employed. Alternatively, as a material of photoelectric conversion element 9, for example, a compound semiconductor, such as GaAs or InGaAs, may be employed.

Light-guide sheet 8 is an optical sheet that takes incident light 11 into light-guide sheet 8. Light-guide sheet 8 holds taken incident light 11 inside light-guide sheet 8, converts taken incident light 11 into trapped light 12, and makes trapped light 12 propagate to end face 8e of light-guide sheet 8. Specifically, light-guide sheet 8 takes incident light 11 into light-guide sheet 8, changes a traveling direction of incident light 11, and waveguides incident light 11 to the end face of light-guide sheet 8 that is located along an axis intersecting with a light-receiving direction. More specifically, light-guide sheet 8 takes incident light 11 into light-guide sheet 8, and converts incident light 11 into trapped light 12 that travels (is waveguided) inside light-guide sheet 8 in a direction different from the traveling direction of incident light 11. In addition, light-guide sheet 8 has a function of guiding trapped light 12 to end face 8e while suppressing emission to an outside of light-guide sheet 8 (specifically, on a z-axis side illustrated in FIGS. 1A to 1C).

It is assumed that a shape on the xy-plane of light-guide sheet 8 is a regular hexagon in which one side has a length of 2a. Width W of the regular hexagon is calculated according to Equation (2), and area S is calculated according to Equation (3).

[Equation 2]

$$w = 2\sqrt{3}a \quad (2)$$

[Equation 3]

$$S = 6\sqrt{3}a^2 \quad (3)$$

Figure 1D:
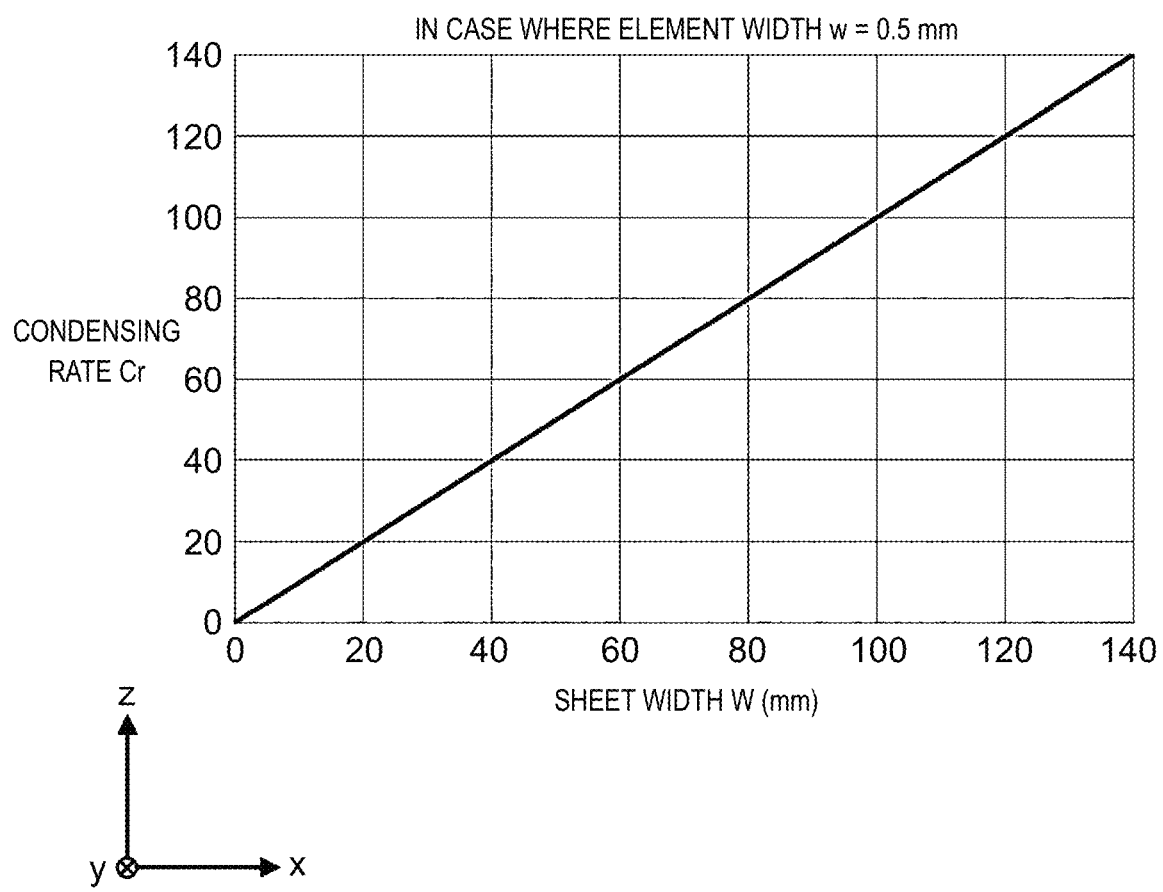
FIG. 1D is an explanatory diagram illustrating a relationship between a width of a sheet and a condensing rate.

It is assumed that a width of photoelectric conversion element 9 is element width w. Condensing rate Cr (a ratio of an area of a light-guide sheet to an area of a photoelectric conversion element) is calculated according to Equation (4). FIG. 1D illustrates a relationship between condensing rate Cr and sheet width W under the assumption that w=0.5 mm.

[Equation 4]

$$Cr = \frac{S}{12aw/2} = \frac{2\sqrt{3}a}{2w} \quad (4)$$

As is apparent from FIG. 1D, if sheet width W is greater than or equal to 100 mm, condensing rate Cr can be greater than or equal to 100 times.

Parts (a) and (b) of FIG. 2 are schematic perspective views for explaining a structure of a light-guide sheet according to the first exemplary embodiment. Part (c) of FIG. 2 is a schematic sectional view for explaining the light-guide sheet according to the first exemplary embodiment and a propagation path of light.

Light-guide sheet 8 includes a plurality of single-color light-guide sheets 8a, 8b, 8c to 8j that has been stacked to sandwich a gap of an air layer via transparent spacers such as beads. Without beads, the plurality of single-color light-guide sheets may have a gently corrugated surface, and may be stacked to sandwich the gap of the air layer and come into contact with each other at vertexes of a corrugation. Taking single-color light-guide sheet 8 as an example, single-color light-guide sheet 8a includes stacked sheets 7a, 7a' that have the same structure. Stacked sheets 7a, 7a' have been bonded to sandwich transparent adhesive layer 6a. Stacked sheet 7a includes transparent sheet substrate 1a and optical coupling layer 5a that has been stacked on sheet substrate 1a. Optical coupling layer 5a has a structure in which transparent layers having a higher refractive index (higher refractive index layers 3a) and buffer layers having a lower refractive index (lower refractive index layers 4a) have been alternately stacked with the buffer layer (lower refractive index layer 4a) sandwiched between the transparent layers (higher refractive index layers 3a). The transparent layer (higher refractive index layer 3a) is provided with a diffraction grating. Optical coupling layer 5a has a function of coupling incident light to waveguided light.

Sheet substrate 1a (1a') includes grating 5g (a diffraction grating) on surface 2a (2a') on a stacking side. Surface 1as (1as') on a side opposite to the stacking side is a smooth flat surface. A pattern of grating 5g is divided in a honeycomb shape. Each regular hexagon includes circular grating 5g that is concentric with respect to a center inside the regular hexagon. Each of the divided grating patterns is referred to as a partial pattern. On surface 2a (2a') on the stacking side, higher refractive index layers 3a (3a') and lower refractive index layers 4a (4a') have been alternately stacked in a state where a shape of grating 5g is maintained. Higher refractive index layer 3a (3a') is a transparent layer having a higher refractive index, such as SiN or $Ta_2O_5$. Lower refractive index layer 4a (4a') is a transparent layer having a lower refractive index, such as $SiO_2$. Higher refractive index layers 3a (3a') and lower refractive index layers 4a (4a') function as optical coupling layer 5a (5a'). Adhesive layer 6a described above bonds optical coupling layers 5a and 5a' to each other. Single-color light-guide sheet 8a has a smallest pitch of grating 5g. A pitch of grating 5g increases on a lower layer side (in order of 8b and 8c). Note that higher refractive index layers 3a, 3a', lower refractive index layers 4a, 4a', and optical coupling layers 5a, 5a' are collectively referred to as higher refractive index layer 3, lower refractive index layer 4, and optical coupling layer 5, respectively.

Incident light 11 that enters light-guide sheet 8 enters single-color light-guide sheet 8a on an uppermost surface, and becomes incident light 11ia in optical coupling layers 5a, 5a'. Part of incident light 11ia is coupled in optical coupling layers 5a, 5a', is converted into waveguided light 11ga, and propagates in the optical coupling layers. When waveguided light 11ga has propagated to optical coupling layers 5a, 5a' in a regular hexagon close to an input position, waveguided light 11ga is emitted upward and downward in a present position, and becomes radiated light 11ra. An emission angle (an angle with respect to a surface normal of the optical coupling layer) of radiated light 11ra is larger than an incident angle (an angle with respect to a surface normal of an optical coupling layer) of incident light 11ia, and part of radiated light 11ra becomes totally reflected light on surfaces 1as, 1as' of sheet substrates 1a, 1a', and becomes trapped light 12a. Once light becomes trapped light 12a, a light propagation angle never decreases. Therefore, trapped light 12a stably propagates in single-color light-guide sheet 8a without loss, and is trapped in the sheet.

A component that is not coupled in optical coupling layers 5a, 5a' in incident light 11ia that has entered optical coupling layers 5a, 5a' or a component that has increased in a propagation angle but has not become totally reflected light (trapped light 12a) in radiated light 11ra is transmitted through single-color light-guide sheet 8a, enters single-color light-guide sheet 8b that is located on a lower layer, and repeats the phenomenon described above in single-color light-guide sheet 8b.

In single-color light-guide sheet 8a serving as an uppermost layer, light on a shorter wavelength side such as blue is trapped, and light on a longer wavelength side is trapped in a lower layer. Light ranging from visible light to near infrared light is trapped in an entirety of light-guide sheet 8.

FIG. 3 is a schematic perspective view for explaining an optical coupling structure and a propagation path of light inside a light-guide sheet according to the first exemplary embodiment.

Part of incident light 11i is coupled in optical coupling layer 5L having a regular hexagonal shape, is converted into waveguided light 11g, and propagates in the optical coupling layer. Waveguided light 11g is emitted upward and downward in optical coupling layer 5R that is close to an input position and has a regular hexagonal shape, and waveguided light 11g becomes radiated light 11r. An emission angle (an angle with respect to a surface normal of an optical coupling layer) of radiated light 11r is always larger than an incident angle (an angle with respect to a surface normal of an optical coupling layer) of incident light 11i. It is assumed, for example, that a spread of incident light 11i is illustrated as SI. A spread of radiated light 11r increases toward a wide angle side, as illustrated as SR. This principle holds true for respective rays of light having all of the incident angle.

FIG. 4A is a plan view illustrating a relationship between an optical coupling structure and an optical coupling orientation inside a light-guide sheet according to the first exemplary embodiment.

In optical coupling structure 5, it is assumed that a center of one regular hexagon is center A, a center of a regular hexagon that is adjacent to the one regular hexagon is center B, a center of a regular hexagon that is adjacent to the adjacent regular hexagon is center C, and a pitch of grating 5g is pitch Λ. It is assumed that a propagation vector of light that enters a regular hexagon having center A, is input and coupled, and propagates toward center B is vector B1 and an angle between vector B1 and vector AB is ω. When waveguided light that propagates in a direction of vector B1 enters a regular hexagon having center B, angle ωb between vector B1 and grating vector B2 in a present position is equal to 2ω. It is assumed that a propagation vector of light that enters the regular hexagon having center A, is input and coupled, and propagates toward center C is vector C1 and an angle between vector C1 and vector AC is ω. When waveguided light that propagates in a direction of vector C1 enters a regular hexagon having center C, angle ωc between vector C1 and grating vector C2 in a present position is larger than 2ω.

FIGS. 4B and 4C are respectively an explanatory diagram using a three-dimensional vector diagram and an explanatory diagram using a two-dimensional vector diagram, and illustrate a relationship among an incident vector, a waveguide vector, a grating vector, and an emission vector.

In FIG. 4B, spherical surfaces that respectively have refractive indices 1, n, $n_{eff}$ with origin O as a center on xyz coordinates are examined.

Refractive index n is a refractive index of sheet substrates (1a, 1a', or the like), and refractive index $n_{eff}$ is an effective refractive index of a light-transmissive layer with respect to waveguided light. Point R is located on the spherical surface having refractive index $n_{eff}$, points P', Q' are located on the spherical surface having refractive index n, point P''' is located on the spherical surface having refractive index 1, points P, Q, R are located on an xy-plane, and straight line PR passes through origin O. Both circles 14p, 14q that pass through point P are located on the xy-plane. Points P, P', P''' are located on the same straight line, point P is a foot of a perpendicular drawn from points P' and P''' to the xy-plane, and point Q is a foot of a perpendicular drawn from point Q' to the xy-plane. An incident vector of incident angle θ in sheet substrates (1a, 1a', or the like) is vector P'O. If the incident vector is converted into incidence from the air, the incident vector corresponds to vector P'''O. Point P is located on circle 14p having a radius of n×sin θ with point O as a center. The radius of circle 14p corresponds to a numerical aperture (NA) of incident light. Grating 5g in a regular hexagon is a concentric circle with point O as a center. Therefore, an orientation of a grating vector matches a radius direction.

Accordingly, a condition for incident light being waveguided in a PR direction is that a magnitude of vector PR is equal to an integral multiple of the grating vector (magnitude: Λ/λ, where Λ is a pitch of grating 5g, and λ is a wavelength) (see Equation (1)), and a waveguide vector is OR. Vector OR corresponds to vector B1 in FIG. 4A, and an angle between vector OR and the x-axis is ω.

When waveguided light that propagates along vector OR enters a close regular hexagon, grating vector RQ in a present position has angle ω' with respect to vector OR (grating vector RQ corresponds to grating vectors B2, C2 in FIG. 4A). End point Q of grating vector RQ is located on circle 14q having a radius of Λ/λ with point R as a center. It is assumed that an intersection point of a perpendicular drawn from point Q and the spherical surface having radius n (refractive index n) is Q'. Vector OQ' is a propagation vector (an emission vector) of light that is emitted from a grating coupler in a close regular hexagon. If line QQ' does not intersect with the spherical surface having radius 1 (refractive index 1), radiated light is totally reflected by surface (1as, 1as', or the like) that faces the air in sheet substrate (1a, 1a', or the like), and the radiated light is trapped in a sheet. Circle 14q is circumscribed on circle 14p at point P. Therefore, an NA of the radiated light is always greater than an NA of incident light (this is referred to as an angle widening effect). When point Q is located outside a circle having radius n (refractive index n), radiated light is not generated, and waveguided light continues to propagate without loss. Finally, the waveguided light enters one of regular hexagons, and light is emitted (an emission condition is always satisfied in one of regular hexagons, as is indicated by a difference between angles ωb, ωc in a regular hexagon having center B and a regular hexagon having center C in FIG. 4A). An NA of the radiated light is always greater than an NA of incident light.

Electromagnetic analysis using the finite-difference time-domain (FDTD) method was performed in order to examine the angle widening effect described with reference to FIGS. 4A to 4C.

FIG. 5 illustrates an analysis model of electromagnetic analysis using the FDTD method. Parts (a) and (b) of FIG. 5 are respectively a plan view and a sectional view of an optical coupling structure inside a light-guide sheet according to the first exemplary embodiment that was used in electromagnetic analysis. Parts (c) and (d) of FIG. 5 are respectively a plan view and a sectional view that illustrate input light, guided waves, and a state of emission, and in parts (c) and (d) of FIG. 5, a light intensity distribution obtained as a result of electromagnetic analysis has been superimposed.

In parts (a) and (b) of FIG. 5, it is assumed that a width (along an x-axis) of a regular hexagon of optical coupling layer 5L, 5R is 10 μm, grating 5g has a triangular section having pitch Λ of 0.24 μm and a depth of 0.09 μm, higher refractive index layer 3 is a $Ta_2O_5$ film having a thickness of 0.15 μm, and lower refractive index layer 4 is a $SiO_2$ film. A boundary condition of analysis along each of the x-axis, a y-axis, and a z-axis is a perfectly matched layer (PML) (absorbing boundary condition). In parts (c) and (d) of FIG. 5, a light source having a size of 10 μm square is disposed as incident light 11 in a right half (as illustrated with a broken line in part (c) of FIG. 5) of xy coordinates to be close to higher refractive index layer 3 within lower refractive index layer 4 (as illustrated with a broken line in part (d) of FIG. 5). A wavelength of the light source is 0.60 μm, an incident angle is 25 degrees (NA=0.42) with respect to the z-axis on an xz-plane, and polarization is S polarization (an electric vector points a y-axis direction).

Part (c) of FIG. 5 illustrates an intensity distribution on an xy-section of waveguided light that is input and coupled in optical coupling layer 5R that occupies the right half of the xy-coordinates and propagates toward optical coupling layer 5L.

Part (d) of FIG. 5 is an intensity distribution diagram on an xz-section. A state of emission of light from optical coupling layers 5L, 5R (rays of radiated light 15a, 15b, 15c, 15d) is illustrated as an arrow (note that radiated light 15c principally includes a reflected component and radiated light 15d principally includes a transmitted component).

All of parts (a), (b), (c), and (d) of FIG. 6 are intensity distribution diagrams illustrating directivity of a far field of light. Parts (a), (b), (c), and (d) of FIG. 6 respectively correspond to the rays of radiated light 15a, 15b, 15c, 15d in part (d) of FIG. 5.

Note that it is assumed that an incident angle of incident light 11 in lower refractive index layer 4 includes x-axis component θx and y-axis component θy, a horizontal axis indicates an x-axis NA (=sin θx), and a vertical axis indicates a y-axis NA (=sin θy).

In parts (c) and (d) of FIG. 6, an intensity (arrow A) is concentrated on a position where (sin θx, sin θy) of incident light=(0.42, 0.00). This reflects reflected light and transmitted light in higher refractive index layer 3.

In contrast, in parts (a) and (b) of FIG. 6, an intensity distribution (arrow B) spreads to be circumscribed on a circle having an NA of 0.42, and extends to an outside of a total reflection condition with respect to the air (NA=1/n=0.69, and n (refractive index of lower refractive index layer 4)=1.45). An intensity distribution pointed by arrow C is an analysis error (this is generated because randomness remains in expression of a shape of a grating due to the limits of a grid interval and part of waveguided light is scattered).

It is apparent from an analysis result of FIG. 6 that the angle widening effect described with reference to FIGS. 4A to 4C (an effect by which an NA of radiated light is always greater than an NA of incident light) is exhibited.

FIG. 7A is a schematic sectional view for explaining an optical coupling structure and an incident path of light inside a light-guide sheet according to the first exemplary embodiment.

Optical coupling layers 5a, 5a' are bonded to each other by adhesive layer 6a. Thickness t of optical coupling layer 5a, 5a' is, for example, 10 μm, width W of a regular hexagon is, for example, about 10 μm, thickness s of adhesive layer 6a is about several microns.

Incident light 16a that has entered single-color light-guide sheet 8a and has been transmitted through sheet substrate 1a' obliquely enters optical coupling layer 5a', and is input and coupled in areas 17a, 17b (different regular hexagonal areas that are located in positions different from each other along a z-axis). Incident light 16a that has not been coupled enters optical coupling layer 5a that is located in a lower layer, and is input and coupled in areas 17c, 17d (different regular hexagonal areas that are located in positions different from each other along the z-axis). Incident light 16A that has been transmitted through sheet substrate 1a' obliquely enters optical coupling layer 5a', and is input and coupled in areas 17A, 17A (different regular hexagonal areas that are located in positions different from each other along the z-axis). Incident light 16A that has not been coupled enters optical coupling layer 5a that is located in a lower layer, and is input and coupled in areas 17C, 17D (different regular hexagonal areas that are located in positions different from each other along the z-axis).

FIG. 7B is a plan view illustrating a relationship between an optical coupling structure and a coupling area. FIG. 7C is a plan view illustrating a relationship between optical coupling structures and coupling areas on upper and lower sides in a case where optical coupling layers have been made to overlap each other to be misaligned by a half cycle.

In FIG. 7B, an area in which incident light 16a can be input and coupled in optical coupling layer 5a' in a plan view is denoted by 18a', and an area in which incident light 16A can be input and coupled is denoted by 18A'.

Light fluxes that correspond to rays of incident light 16a, 16A are present in all of the regular hexagonal areas. Areas that correspond to coupling areas 18a', 18A are also present in all of the regular hexagonal areas. Further, when incident light is continuously moved from incident light 16a to incident light 16A, coupling areas 18a', 18A' are continuously formed, and a final coupling area has a shape denoted by 18'. The same is applied to an area in which incident light can be input and coupled in optical coupling layer 5a.

Accordingly, as illustrated in FIG. 7C, in a case where optical coupling layer 5a' (illustrated with a solid line) and optical coupling layer 5a (illustrated with a broken line) have been made to overlap each other to be misaligned by a half cycle along an x-axis and a y-axis, coupling area 18' in optical coupling layer 5a' and coupling area 18 in optical coupling layer 5a are located to mutually cover a gap, and almost an entire area can be covered with a coupling area.

FIG. 8A is an explanatory sectional view of a two-dimensional analysis model illustrating a state of light that enters a six-layer optical coupling layer for explaining angular dependence of optical input efficiency of optical coupling layer 5 according to the first exemplary embodiment. FIG. 8B is an explanatory diagram illustrating angular dependence of efficiency of inputting light to optical coupling layer 5 by using a wavelength as a parameter.

In FIG. 8A, optical coupling layer 5 includes six higher refractive index layers 3 of $Ta_2O_5$ (thickness: 0.19 μm) that have been stacked in such a way that lower refractive index layer 4 of $SiO_2$ (thickness: 0.27 μm) is sandwiched between higher refractive index layers 3. An uppermost $SiO_2$ layer is in contact with the air. Incident light 11 is emitted into (enters) the uppermost $SiO_2$ layer in S polarization. If incident angle θ is estimated using an angle in a $SiO_2$ layer, a condition for total reflection on an uppermost surface of the $SiO_2$ layer is that θ=43.6 degrees. Grating 5g has a pitch of 0.24 µm and a width of 5 µm, and incident light 11 has the same width. All of the analysis boundaries are PMLs.

In FIG. 8B, a wavelength changes at every 0.05 µm within a range of 0.50 µm to 0.65 µm. As a wavelength changes from a shorter wavelength to a longer wavelength, an incident angle at which coupling efficiency becomes maximum increases. A maximal value of coupling efficiency appears twice at a single wavelength. A maximal value on a side of a smaller incident angle corresponds to coupling in the 0th order waveguide mode, and a maximal value on a side of a larger incident angle corresponds to coupling in the 1st order waveguide mode (see FIG. 18D). A grating has a small width. Therefore, in the case of a large incident angle, a propagation range of incident light overlaps a grating area in a small range, and only two or three upper layers contribute to input coupling. However, a coupling efficiency having a peak of 50% or more at maximum is obtained under any condition. In a comparison among respective peaks with respect to an intensity half-value width, a width in the 1st order waveguide mode is greater than a width in the 0th order waveguide mode, and a width at a longer wavelength is greater than a width at a shorter wavelength.

FIG. 9 is an explanatory diagram for explaining single optical coupling layer 5 according to the first exemplary embodiment and a coherence length of light that enters optical coupling layer 5.

In FIG. 9, in optical coupling layer 5, higher refractive index layer 3 of $Ta_2O_5$ (thickness: 0.34 µm) is sandwiched between lower refractive index layers 4 of $SiO_2$. Incident light 11 having coherence length L is made incident from a side of an upper $SiO_2$ layer in S polarization. Incident angle θ is estimated using an angle in a $SiO_2$ layer. A grating has a pitch of 0.45 µm and width W of 5.6 µm, and incident light 11 has the same width. Two-dimensional analysis is performed, and all of the analysis boundaries are PMLs.

FIG. 10A is an explanatory diagram illustrating wavelength dependence of efficiency of inputting light to optical coupling layer 5 illustrated in FIG. 9.

FIG. 10A is an optical intensity distribution diagram illustrating a simulation result in a case where incident light 11 is made vertically incident on optical coupling layer 5 on an xy-plane in FIG. 9 and is coupled to waveguided light. Here, the wavelength dependence is efficiency (coupling efficiency) of incident light 11 being taken into optical coupling layer 5 and being coupled to waveguided light in a case where a wavelength of incident light 11 is changed.

FIG. 10B is an explanatory diagram illustrating angular dependence of the efficiency of inputting light to optical coupling layer 5 illustrated in FIG. 9.

Here, the angular dependence is efficiency (coupling efficiency) of incident light 11 being taken into optical coupling layer 5 and being coupled to waveguided light in a case where incident angle θ of incident light 11 is changed in FIG. 9.

Note that pulse light was used as incident light 11 made incident on optical coupling layer 5. Stated another way, incident light 11 used in this analysis is light having coherence length L, and incident light 11 is light that forms homogeneous electromagnetic waves having wavelength λ within a range of time widths defined by L/C where C is a speed of light. In addition, in incident light 11 used in the analysis, an electromagnetic wave amplitude was set to 0 outside a range of coherence length L at which electromagnetic waves are formed. Analysis results illustrated in FIGS. 10A and 10B have been plotted by using coherence length L as a parameter.

As illustrated in FIG. 10A, in a case where coherence length L is longer (in the case of what is called coherent light), a coupling efficiency with respect to a wavelength forms an acute curve having a narrow peak width. The curve has two peaks indicating a higher coupling efficiency (the two peaks correspond to a 0th order mode and a 1st order mode of waveguided light) at a wavelength of 0.83 µm (this corresponds to P1 in FIG. 18D) and a wavelength of 0.71 µm (this corresponds to P2 in FIG. 18D). As coherence length L decreases (as incident light is changed to what is called incoherent light), a plurality of peaks that have been recognized is changed to wide curves.

As illustrated in FIG. 10B, in a case where coherence length L is longer, two peaks indicating a higher coupling efficiency (the two peaks correspond to the 0th order mode and the 1st order mode of waveguided light) appear at an incident angle of 0 degrees (this corresponds to P1 in FIG. 18D) and an incident angle of 21 degrees (this corresponds to P2 in FIG. 18D). In addition, each of the two peaks has an acute curve having a narrow peak width. As coherence length L decreases, the two peaks are changed to curves having a larger peak width.

It is assumed that a light source is the sun. Coherence length L of sunlight is several micrometers. Stated another way, in a case where sunlight is made incident, in optical coupling layer 5 of the light-guide sheet according to the first exemplary embodiment, light having a wide wavelength range and a wide incident angle range is input and coupled, and the light becomes waveguided light.

Part (a) of FIG. 11 is an explanatory diagram illustrating a coupling range with respect to a wavelength and an incident angle, and the coupling range is estimated on the basis of the result of FIG. 8B.

In part (a) of FIG. 11, a white arrow indicates a maximal value range of a coupling efficiency in the 0th order waveguide mode, and a hatched arrow indicates a maximal value range of a coupling efficiency in the 1st order waveguide mode. A center of an arrow corresponds to a maximal value position, and a terminal end of an arrow corresponds to an intensity half-value position. It is indicated that both the white arrow and the hatched arrow move from an upper-left part (a shorter wavelength and a smaller angle) to a lower-right part (a longer wavelength and a larger angle) in the drawing.

Part (b) of FIG. 11 is an explanatory diagram illustrating a coupling range with respect to a wavelength and an incident angle in the case of incoherent light. The coupling range is estimated on the basis of the results of part (a) of FIG. 11, FIG. 10A and FIG. 10B. As illustrated in FIG. 10A and FIG. 10B, in a result in a case where coherence length L=7.15 µm (incoherent light), an angular width is approximately three times an angular width in a result in a case where L=143 µm (coherent light). According to this result, in part (b) of FIG. 11, lengths of white arrows and hatched arrows in part (a) of FIG. 11 have increased three times. White arrows and hatched arrows overlap each other without a gap. This indicates that light having a wide wavelength range and a wide incident angle range can be input and coupled, even in a case of a single grating pitch. As is apparent from FIGS. 10A and 10B, by using incoherent light, a wavelength range and an incident angle range are widened, but a maximum value of coupling efficiency decreases. However, in light-guide sheet 8 according to the first exemplary embodiment, optical coupling layer 5a or the like is formed to have a stacking structure, as illustrated in part (c) of FIG. 2. By sufficiently increasing a number of stacked layers, coupling efficiency can be improved to be close to 100%. Accordingly, in light-guide sheet 8 according to the first exemplary embodiment, the wavelength range and the incident angle range can be widened in a state where a higher coupling efficiency is maintained.

FIG. 12 is a perspective view explaining a process in which single-color incident light is coupled in an optical coupling layer, an angle is widened, the incident light is emitted, and the incident light becomes trapped light according to the first exemplary embodiment.

It is assumed that incident light 11 made incident on light-guide sheet 8 has wavelength λ of 0.4 μm. Incident light 11 is divided into annular numerical aperture areas (rays of incident light 11a, 11b, 11c, 11d) in descending order of an NA. In light-guide sheet 8, single-color light-guide sheets 8a, 8b, 8c, 8d are sequentially stacked in ascending order of a pitch of grating 5g of optical coupling layer 5 from an incident side of light (in FIG. 12, Λ is the pitch of grating 5g, and N is an effective refractive index). In FIG. 12, states of incidence and emission of light are explained by using a position of a start point of an incident vector (point P in FIG. 4B) and a position of an end point of an emission vector (point Q in FIG. 4B). In a case where wavelength λ=0.4 μm, only light having a larger NA can be coupled in single-color light-guide sheet 8a.

Accordingly, rays of incident light 11b, 11c, 11d are transmitted through single-color light-guide sheet 8a. However, incident light 11a is input and coupled in single-color light-guide sheet 8a (part (a) of FIG. 12). An NA increases due to the angle widening effect, and incident light 11a is emitted as radiated light 11a' (part (A) of FIG. 12). End point Q of a vector of radiated light 11a' is located outside a sphere having a radius of refractive index 1, and therefore radiated light 11'a is trapped in single-color light-guide sheet 8a.

Rays of incident light 11c, 11d are transmitted through single-color light-guide sheet 8b. However, incident light 11b is input and coupled in single-color light-guide sheet 8b (part (b) of FIG. 12). An NA increases due to the angle widening effect, and incident light 11b is emitted as radiated light 11b' (part (B) of FIG. 12). Part of incident light 11b' is trapped in single-color light-guide sheet 8b, and a residue is emitted upward and downward. A component emitted upward is input and coupled in single-color light-guide sheet 8a (part (a) of FIG. 12). An NA increases due to the angle widening effect, and the component emitted upward is emitted as radiated light 11a' (part (A) of FIG. 12). End point Q of the vector of radiated light 11a' is located outside the sphere having a radius of refractive index 1, and therefore radiated light 11'a is trapped in single-color light-guide sheet 8a. All of the single-color light-guide sheets that are present on a lower side have a larger pitch of grating 5g, therefore there is a possibility that a component emitted downward will be diffracted and an NA will change. However, the component emitted downward is reflected by a lowermost layer (this will be described with reference to FIG. 13), and the angle widening effect is repeated. As a result, the component emitted downward finally returns to single-color light-guide sheet 8a in a state where the component emitted downward has a larger NA. The component emitted downward is trapped in single-color light-guide sheet 8a.

Incident light 11d is transmitted through single-color light-guide sheet 8c. However, incident light 11c is input and coupled in single-color light-guide sheet 8c (part (c) of FIG. 12). An NA increases due to the angle widening effect, and incident light 11c is emitted as radiated light 11c' (part (C) of FIG. 12). Part of incident light 11c' is trapped in single-color light-guide sheet 8c, and a residue is emitted upward and downward. All of the emitted components finally return to single-color light-guide sheet 8b, and are input and coupled (part (b) of FIG. 12). An NA increases due to the angle widening effect, and all of the emitted components are emitted as radiated light 11b' (part (B) of FIG. 12). Part of incident light 11b' is trapped in single-color light-guide sheet 8b, and a residue is emitted upward and downward. All of the emitted components finally return to single-color light-guide sheet 8a, and are input and coupled. An NA increases due to the angle widening effect, and all of the emitted components are trapped in single-color light-guide sheet 8a.

Incident light 11d is input and coupled in single-color light-guide sheet 8d (part (d) of FIG. 12). An NA increases due to the angle widening effect, and incident light 11d is emitted as radiated light 11d' (part (D) of FIG. 12). Part of incident light 11d' is trapped in single-color light-guide sheet 8d, and a residue is emitted upward and downward. All of the emitted components finally return to single-color light-guide sheet 8c, and are input and coupled (part (c) of FIG. 12). An NA increases due to the angle widening effect, and all of the emitted components are emitted as radiated light 11c' (part (C) of FIG. 12). Part of incident light 11c' is trapped in single-color light-guide sheet 8c, and a residue is emitted upward and downward. All of the emitted components finally return to single-color light-guide sheet 8b, and are input and coupled (part (b) of FIG. 12). An NA increases due to the angle widening effect, and all of the emitted components are emitted as radiated light 11b' (part (B) of FIG. 12). Part of incident light 11b' is trapped in single-color light-guide sheet 8b, and a residue is emitted upward and downward. All of the emitted components finally return to single-color light-guide sheet 8a, and are input and coupled. An NA increases due to the angle widening effect, and all of the emitted components are trapped in single-color light-guide sheet 8a.

Accordingly, in single-color light (wavelength λ=0.4 λm), components of all of the NAs are trapped in single-color light-guide sheets 8a, 8b, 8c, 8d.

FIG. 13 is a sectional view explaining a process in which multi-color incident light is coupled in an optical coupling layer, an angle is widened, the incident light is emitted, and the incident light becomes trapped light according to the first exemplary embodiment. It is assumed that incident light 11 made incident on light-guide sheet 8 has wavelength λ of 0.40 μm. Incident light 11 is classified into circular numerical aperture areas (rays of incident light 11A, 11B, 11C, 11D) in descending order of an NA. In light-guide sheet 8, single-color light-guide sheets 8a, 8b, 8c, 8d, 8e have been sequentially stacked in ascending order of a pitch of grating 5g of optical coupling layer 5 from an incident side of light. Protective sheet 19a is provided on a side of an uppermost surface of single-color light-guide sheets 8a, 8b, 8c, 8d, 8e via gap. Reflective sheet 19b is provided on a side of a lowermost surface of light-guide sheets 8a, 8b, 8c, 8d, 8e via a gap. Reflective sheet 19b is a reflection mirror.

In a case where wavelength λ=0.4 μm, only light having a larger NA can be coupled in single-color light-guide sheet 8a. Incident light 11B that is a component having a smaller NA in incident light 11A is transmitted through single-color light-guide sheet 8a. However, a component having a larger NA is input and coupled in single-color light-guide sheet 8a. The NA increases due to the angle widening effect, and the component having a larger NA becomes trapped light 12a.

Incident light 11C that is a component having a smaller NA in incident light 11B is transmitted through single-color light-guide sheet 8b. However, a component having a larger NA is input and coupled in single-color light-guide sheet 8b. The NA increases due to the angle widening effect, part of the component having a larger NA becomes trapped light 12b, and a residue is emitted upward and downward. Radiated light 11b' that is a component emitted upward is input and coupled in single-color light-guide sheet 8a, an NA increases due to the angle widening effect, and radiated light 11b' becomes trapped light 12a.

All of the single-color light-guide sheets that are present on a lower side have a larger pitch of grating 5g. Therefore, there is a possibility that a component emitted downward will be diffracted and an NA will change. However, the component emitted downward is reflected by reflective sheet 19b in a lowermost layer, and the angle widening effect is repeated. As a result, the component emitted downward finally returns to single-color light-guide sheet 8a in a state where the component emitted downward has a larger NA, and is input and coupled. The NA increases due to the angle widening effect, and the component emitted downward becomes trapped light 12a.

Incident light 11D that is a component having a smaller NA in incident light 11C is transmitted through single-color light-guide sheet 8c. However, a component having a larger NA is input and coupled in single-color light-guide sheet 8c. The NA increases due to the angle widening effect, part of the component having a larger NA becomes trapped light 12c, and a residue is emitted upward and downward. All of the emitted components finally return to single-color light-guide sheet 8b, and are input and coupled. An NA increases due to the angle widening effect, some of the emitted components become trapped light 12b, and a residue is emitted upward and downward. All of the emitted components finally return to single-color light-guide sheet 8a, and are input and coupled. An NA increases due to the angle widening effect, and all of the emitted components become trapped light 12a.

Incident light 11D that is a component having a smaller NA is input and coupled in single-color light-guide sheet 8d. An NA increases due to the angle widening effect, part of incident light 11D becomes trapped light 12d, and a residue is emitted upward and downward. All of the emitted components finally return to single-color light-guide sheet 8c, and are input and coupled. An NA increases due to the angle widening effect, some of the emitted components become trapped light 12c, and a residue is emitted upward and downward. All of the emitted components finally return to single-color light-guide sheet 8b, and are input and coupled. An NA increases due to the angle widening effect, some of the emitted components become trapped light 12b, and a residue is emitted upward and downward. All of the emitted components finally return to single-color light-guide sheet 8a, and are input and coupled. An NA increases due to the angle widening effect, and all of the emitted components become trapped light 12a. Stated another way, respective rays of light that have wavelength λ of 0.40 μm and have all of the NAs are trapped by single-color light-guide sheets 8a, 8b, 8c, 8d.

In contrast, it is assumed that incident light 11' made incident on light-guide sheet 8 has λ of 0.55 μm on a longer wavelength side, as illustrated in FIG. 13. A relationship among coupling, emission, and trapping of light is established in a state moved downward by one single-color light-guide sheet. Stated another way, incident light 11' is transmitted through single-color light-guide sheet 8a, coupling, emission, and trapping of light are performed in single-color light-guide sheets 8b, 8c, 8d, 8e, and respective rays of light having all of the NAs are trapped. In a relationship among coupling, emission, and trapping of light, single-color light-guide sheets 8a, 8b, 8c, 8d and rays of incident light 11A, 11B, 11C, 11D in a case where λ=0.40 μm respectively correspond to single-color light-guide sheets 8b, 8c, 8d, 8e and rays of incident light 11B', 11C', 11D', 11E' in a case where λ=0.55 μm.

Accordingly, single-color light-guide sheets 8b, 8c, 8d contribute to trapping of light having λ of 0.55 μm in addition to light having λ of 0.40 μm. As described above, by disposing single-color light-guide sheets in ascending order of a pitch of grating 5g, the respective sheets contribute to trapping of a wavelength within a certain range in cooperation with each other. Due to a chain action of these sheets, even a small number of sheets can trap light having a wide range (for example, from blue to near infrared light).

[Method For Manufacturing Light-Guide Sheet]

Next, a method for manufacturing light-guide sheet 8 according to the first exemplary embodiment is described.

FIG. 14 is a schematic explanatory diagram illustrating an example of a procedure of manufacturing a light-guide sheet according to the first exemplary embodiment.

Injection molding is performed by using metal mold 30 having a flat surface and metal mold 31 having a grating surface, and sheet substrate 1a is manufactured. In sheet substrate 1a, respective areas each including concentric grating 5g are formed in a honeycomb shape. Film formation is performed according to the self-cloning method, and a higher refractive index film (higher refractive index layer 3a) of $Ta_2O_5$, SiN, or the like and a lower refractive index film (lower refractive index layer 4a) of $SiO_2$ are alternately stacked on a surface on which a grating is disposed in sheet substrate 1a. If a film formation condition of the self-cloning method is satisfied, stacking proceeds while a V-shape of a grating section is maintained within a thickness range of 10 μm or more, and optical coupling layer 5a is formed. Optical coupling layers 5a, 5a' of two sheet substrates 1a, 1a' with an optical coupling layer (stacked sheet 7a, 7a') are disposed to face each other. Areas having a honeycomb shape are made to overlap each other to be misaligned by a half cycle along an x-axis and a y-axis. Sheet substrates 1a, 1a' are ultraviolet (UV)-cured and fixed by using adhesive layer 6a. Thus, single-color light-guide sheet 8a is completed. Single-color light-guide sheets that are different in a pitch of grating 5g are stacked downward in ascending order of the pitch. Protective sheet 19a is disposed on an uppermost surface, and reflective sheet 19b is disposed on a lowermost surface. Bead spacers 32 are thinly scattered between respective sheets, and a uniform air gap is secured. An entirety is fixed, and light-guide sheet 8 is completed. Light leaks in points of contact between bead spacer 32 and each of the sheet substrates, but no problems arise if bead spacer 32 has a small density.

[Effects and the Like]

As described above, light-guide sheet 8 according to the first exemplary embodiment is light-guide sheet 8 that takes in incident light and waveguides light in a direction intersecting with an incident direction of the incident light inside light-guide sheet 8.

Optical coupling layer 5 periodically includes a partial pattern of grating 5g having a minute concentric shape. Therefore, light-guide sheet 8 exhibits an angle widening effect that causes an emission angle to become larger than an incident angle. Incoherence of light is added to the angle widening effect, and incident light 11 having a wide wavelength range and a wide angle range can be trapped. In addition, optical coupling layer 5 is formed by stacking several tens of light-transmissive layers. This enables sufficient coupling efficiency and trapping efficiency to be secured. Therefore, for example, if incident light 11 is sunlight, light-guide sheet 8 can take in sunlight having a wide wavelength range and a wide angle range over a wide area of light-guide sheet 8, can effectively trap the taken sunlight in light-guide sheet 8, and can emit the taken sunlight from end face 8e.

In addition, photoelectric conversion device 100 includes light-guide sheet 8 and photoelectric conversion element 9 that receives light. Photoelectric conversion element 9 is disposed near end face 8e of light-guide sheet 8 that is located along an axis intersecting with a light-receiving direction.

This enables light-guide sheet 8 to effectively guide taken incident light 11 as trapped light 12 to photoelectric conversion element 9. Therefore, by employing photoelectric conversion device 100, photoelectric conversion element 9 can receive a larger amount of light than, for example, an amount of light in a case where photoelectric conversion element 9 directly receives incident light 11. Stated another way, photoelectric conversion device 100 can generate a larger amount of power even in a small area than an amount of power in a case where photoelectric conversion element 9 directly receives incident light 11. In other words, by employing photoelectric conversion device 100, light-guide sheet 8 can take in incident light 11 from outside over a large area of light-guide sheet 8, and can efficiently guide taken incident light 11 to photoelectric conversion element 9. This enables photoelectric conversion to be efficiently performed on incident light 11.

Second Exemplary Embodiment

A second exemplary embodiment is described below with reference to FIGS. 15 to 17.

The second exemplary embodiment is the same as the first exemplary embodiment excluding a difference in a partial pattern of a grating, and a duplicate description is omitted.

FIG. 15 is a schematic perspective view for explaining an optical coupling structure and a propagation path of light inside a light-guide sheet according to the second exemplary embodiment. A partial pattern of grating 5g2 of optical coupling layer 5 is not a concentric circle, but is a concentric polygon. A center of the concentric polygon is a center of a regular hexagon. FIG. 15 illustrates an example in which the concentric polygon is a concentric dodecagon.

Part of incident light 11i is coupled in optical coupling layer 5L2, is converted into waveguided light 11g, and propagates in the optical coupling layer. Waveguided light 11g is emitted upward and downward in optical coupling layer 5R2 inside a regular hexagon that is close to an input position, and waveguided light 11g becomes radiated light 11r. An emission angle (an angle with respect to a surface normal of an optical coupling layer) of radiated light 11r is always larger than an incident angle (an angle with respect to a surface normal of an optical coupling layer) of incident light 11i. It is assumed, for example, that a spread of incident light 11i is indicated as SI. A spread of radiated light 11r is present on a side of a wide angle, as illustrated as SR. This principle holds true for respective rays of light having all of the incident angle. In the first exemplary embodiment, the spread of radiated light 11r is a continuous spread including the same angle as an incident angle (see FIG. 3). However, in the second exemplary embodiment, the spread of radiated light 11r does not include the same angle as an incident angle, and forms a discrete distribution that only includes a wide angle.

In order to examine the angle widening effect described with reference to FIG. 15, electromagnetic analysis using the FDTD method was performed.

FIG. 16 illustrates analysis models of electromagnetic analysis using the FDTD method. Part (a) of FIG. 16 is a plan view of a partial pattern of grating 5g8 having a concentric regular octadecagonal shape. Part (b) of FIG. 16 is a plan view of a partial pattern of grating 5g2 having a concentric regular dodecagonal shape.

In FIGS. 16 and 5, an analysis condition excluding a partial pattern of a grating and disposition of a light source are the same. Light is made incident on optical coupling layers 5R2, 5R8, and rays of radiated light 15a, 15b are emitted from optical coupling layer 5L2.

All of parts (a), (b), (c), and (d) of FIG. 17 are intensity distribution diagrams illustrating directivity of a far field of light. Parts (a) and (b) of FIG. 17 are respectively distribution diagrams of rays of radiated light 15a, 15b from optical coupling layer 5L8 in part (a) of FIG. 16. Parts (c) and (d) of FIG. 17 are respectively distribution diagrams of rays of radiated light 15a, 15b from optical coupling layer 5L2 in part (b) of FIG. 16. Definition of a horizontal axis and a vertical axis is the same as definition in FIG. 6.

In parts (a) and (b) of FIG. 17, an intensity distribution (arrow B) spreads to be circumscribed on a circle having an NA of 0.42, and extends to an outside of a total reflection condition with respect to the air (NA=1/n=0.69, and n (refractive index of lower refractive index layer 4)=1.45). A spread of the intensity distribution is not continuous in contrast to FIG. 6, and is a discrete distribution having a stronger angle widening effect. An intensity distribution pointed by arrow C is an analysis error (this is generated because randomness remains in expression of a shape of a grading due to the limits of a grid interval and part of waveguided light is scattered). In parts (c) and (d) of FIG. 17, a discrete interval increases, and almost all of the distributions are present outside the total reflection condition.

It is apparent from the analysis result of FIG. 17 that an angle widening effect (an effect by which an NA of radiated light is always greater than an NA of incident light) according the present exemplary embodiment is exhibited more strongly than an angle widening effect according to the first exemplary embodiment. Accordingly, a similar light trapping effect can be expected by using a smaller number of sheets than a number of sheets according to the first exemplary embodiment.

Third Exemplary Embodiment

A third exemplary embodiment is described below.

The third exemplary embodiment is the same as the first and second exemplary embodiments excluding a difference in a thickness condition of optical coupling layer 5, and a duplicate description is omitted.

As illustrated in part (c) of FIG. 2, optical coupling layer 5a is formed by alternately stacking higher refractive index layer 3a of $Ta_2O_5$, SiN, or the like and lower refractive index layer 4a of $SiO_2$ or the like. In order to make an effective refractive index of waveguided light 11ga constant, it is preferable that a thickness of higher refractive index layer 3a be constant regardless of a stacking order. However, a thickness of lower refractive index layer 4a does not have any delimiting conditions. When the thickness of lower refractive index layer 4a is constant regardless of a stacking order, an entirety of a stacking structure acts as an optical filter having a greater dispersion characteristic. For example, if the stacking structure has a characteristic of reflecting light having a specified wavelength, the light having the specified wavelength fails to be coupled, and light trapping performance deteriorates. In the third exemplary embodiment, the thickness of lower refractive index layer 4a is set at random within a range from (trapping center wavelength)/(four times refractive index of lower refractive index layer) to (trapping center wavelength)/(twice refractive index of lower refractive index layer). By doing this, a phase of reflected light from each stacked surface changes at random within a range from Π to 2Π. Therefore, a reflectance of combined reflected light can be reduced. Accordingly, the entirety of the stacking structure has a small dispersion characteristic, and trapping performance can be prevented from deteriorating at a specified wavelength.

Other Exemplary Embodiments

As described above, the first, second, and third exemplary embodiments have been described as examples of the technique disclosed in the present application. However, the technique of the present disclosure is not limited to these exemplary embodiments, and is also applicable to other exemplary embodiments that undergo changes, replacements, additions, omissions, or the like, as appropriate. New exemplary embodiments can also be achieved by combining respective components described in the first, second, and third exemplary embodiments described above. Thus, other exemplary embodiments are described below as examples.

For example, in the exemplary embodiments described above, it has been described that a grating is recesses and protrusions on a surface of a light-transmissive layer. However, the grating is not limited to this. For example, the grating may be a periodical structure that is disposed inside the light-transmissive layer and has a difference in a refractive index.

A configuration obtained by appropriately combining the exemplary embodiments described above is conceivable. It is assumed that a light trapping effect similar to a light trapping effect according to the first exemplary embodiment is exhibited, a photoelectric conversion element such as a solar cell is provided on an end face of a light-guide sheet, and taken light is received. In this case, a reduction in a thickness of the sheet enables a reduction in a cost of a photoelectric conversion device, even when an area of the photoelectric conversion element is significantly reduced.

As described above, the exemplary embodiments have been described as examples of the technique of the present disclosure. For this purpose, the accompanying drawings and the detailed description have been provided.

Accordingly, in order to exemplify the technique described above, components illustrated or described in the accompanying drawings and the detailed description may not only include components that are essential for solving the problems, but may also include components that are not essential for solving the problems. Therefore, the unessential components should not be deemed essential just because the unessential components are illustrated or described in the accompanying drawings and the detailed description.

The exemplary embodiments described above have been provided to exemplify the technique according to the present disclosure. Therefore, various changes, replacements, additions, omissions, or the like can be made within the scope of the claims or equivalents of the claims.

INDUSTRIAL APPLICABILITY

A light-guide sheet according to the present disclosure is useful for an optical sheet that can take in light over a large area of the light-guide sheet. In addition, a photoelectric conversion device using the light-guide sheet according to the present disclosure can take in sunlight having a wide angle range and a wide wavelength range (for example, an entire visible light region) over a large area of the light-guide sheet. Therefore, the photoelectric conversion device is useful for a solar power generation device or the like.

What is claimed is:

1. A light-guide sheet that takes in incident light and waveguides light in a direction intersecting with an incident direction of the incident light inside the light-guide sheet, the light-guide sheet comprising:
   a lower refractive index layer;
   a light-transmissive layer that is continuously stacked with the lower refractive index layer and has a refractive index that is higher than a refractive index of the lower refractive index layer; and
   a diffraction grating that is disposed on the light-transmissive layer and changes a travelling direction of the incident light,
   wherein a pattern of the diffraction grating is divided into a plurality of partial patterns on the light-transmissive layer,
   the plurality of partial patterns are in contact with each other, and
   each of the plurality of partial patterns has a plurality of concentric circular shapes or a plurality of concentric polygonal shapes.

2. The light-guide sheet according to claim 1, wherein the pattern of the diffraction grating is divided in a honeycomb shape.

3. The light-guide sheet according to claim 1, wherein a pitch of the diffraction grating is uniform in the light-transmissive layer.

4. The light-guide sheet according to claim 1, wherein a plurality of the light-transmissive layers are stacked with the lower refractive index layer sandwiched between the plurality of light-transmissive layers.

5. The light-guide sheet according to claim 4, wherein a thickness of each of lower refractive index layers change at random in stacking order, each of the lower refractive index layers being the lower refractive index layer.

6. A light-guide sheet comprising two sheets of the light-guide sheets according to claim 2,
   wherein a single-color light-guide sheet includes the two sheets of the light-guide sheets that have been stacked, the light-transmissive layer of one of the two sheets of the light-guide sheets faces the light-transmissive layer of another of the two sheets of the light-guide sheets, and the pattern of the diffraction grating of the one of the two sheets of the light-guide sheets is not aligned with the pattern of the diffraction grating of the another of the two sheets of the light-guide sheets.

7. The light-guide sheet according to claim 6, comprising a plurality of the single-color light-guide sheets each being the single-color light-guide sheet,
   wherein the plurality of single-color light-guide sheets changes in a pitch of the diffraction grating, and
   the plurality of single-color light-guide sheets are stacked in ascending order of the pitch of the diffraction grating from an incident side of the incident light.

8. The light-guide sheet according to claim 7, wherein a reflective sheet is disposed on a surface that is opposite to the incident side of the incident light.

9. The light-guide sheet according to claim 7, wherein bead spacers are disposed between the plurality of single-color light-guide sheets, or between the plurality of single-color light-guide sheets and the reflective sheet that is disposed on a surface that is opposite to the incident side of the incident light.

10. A photoelectric conversion device comprising:
   the light-guide sheet according to claim 1; and
   a photoelectric conversion element that includes a light-receiving surface that receives the light, and converts the light received by the light-receiving surface into power,
   wherein the photoelectric conversion element is disposed around the light-guide sheet, and the light-receiving surface is located to face an end face of the light-guide sheet that is located along an axis intersecting with the incident direction of the incident light.

11. The light-guide sheet according to claim 1, wherein each of the plurality of partial patterns has the plurality of concentric circular shapes.

12. The light-guide sheet according to claim 1, wherein each of the plurality of partial patterns has the plurality of concentric polygonal shapes.

13. The light-guide sheet according to claim 12, wherein each of the plurality of partial patterns has a plurality of concentric octadecagonal shapes as the plurality of concentric polygonal shapes.

14. The light-guide sheet according to claim 12, wherein each of the plurality of partial patterns has a plurality of concentric dodecagonal shapes as the plurality of concentric polygonal shapes.

15. The light-guide sheet according to claim 1, wherein the plurality of partial patterns of the diffraction grating are formed at a same height.

16. The light-guide sheet according to claim 1, wherein the plurality of partial patterns that are in contact with each other are configured to allow the light to propagate through one of the plurality of partial patterns to another one of the plurality of partial patterns.

* * * * *